United States Patent
Yanagidaira et al.

(10) Patent No.: US 7,532,520 B2
(45) Date of Patent: May 12, 2009

(54) SEMICONDUCTOR MEMORY DEVICE AND CONTROL METHOD OF THE SAME

(75) Inventors: Kosuke Yanagidaira, Kawasaki (JP); Koichi Fukuda, Yokohama (JP); Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 11/778,205

(22) Filed: Jul. 16, 2007

(65) Prior Publication Data

US 2008/0019182 A1   Jan. 24, 2008

(30) Foreign Application Priority Data

Jul. 20, 2006 (JP) ............................. 2006-198507
May 22, 2007 (JP) ............................. 2007-135717

(51) Int. Cl.
*G11C 11/34* (2006.01)

(52) U.S. Cl. ............................. 365/185.29; 365/185.19; 365/185.2; 365/185.22; 365/185.24

(58) Field of Classification Search ............ 365/185.29, 365/185.19, 185.2, 185.22, 185.24
See application file for complete search history.

(56) References Cited

U.S. PATENT DOCUMENTS

| | | | | |
|---|---|---|---|---|
| 6,028,794 | A * | 2/2000 | Nakai et al. | 365/185.29 |
| 6,259,629 | B1 * | 7/2001 | Seki et al. | 365/185.22 |
| 6,452,836 | B1 | 9/2002 | Roohparvar | |
| 6,914,816 | B2 | 7/2005 | Sugiura et al. | |
| 7,020,028 | B2 * | 3/2006 | Seki et al. | 365/185.29 |
| 2004/0015649 | A1 | 1/2004 | Chang | |

FOREIGN PATENT DOCUMENTS

| | | |
|---|---|---|
| JP | 8-203286 | 8/1996 |
| JP | 2004-14043 | 1/2004 |

* cited by examiner

*Primary Examiner*—Son Dinh
(74) *Attorney, Agent, or Firm*—Oblon, Spivak, McClelland, Maier & Neustadt, P.C.

(57) ABSTRACT

A semiconductor memory device includes a memory cell array, a voltage generating circuit, a memory circuit which stores a reference pulse number of an erase voltage of the memory cell array and a parameter, and a control circuit which controls, when a pulse number of the erase voltage exceeds the reference pulse number of the erase voltage, the voltage generating circuit in a manner to increase at least an erase verify level in accordance with the parameter.

17 Claims, 29 Drawing Sheets

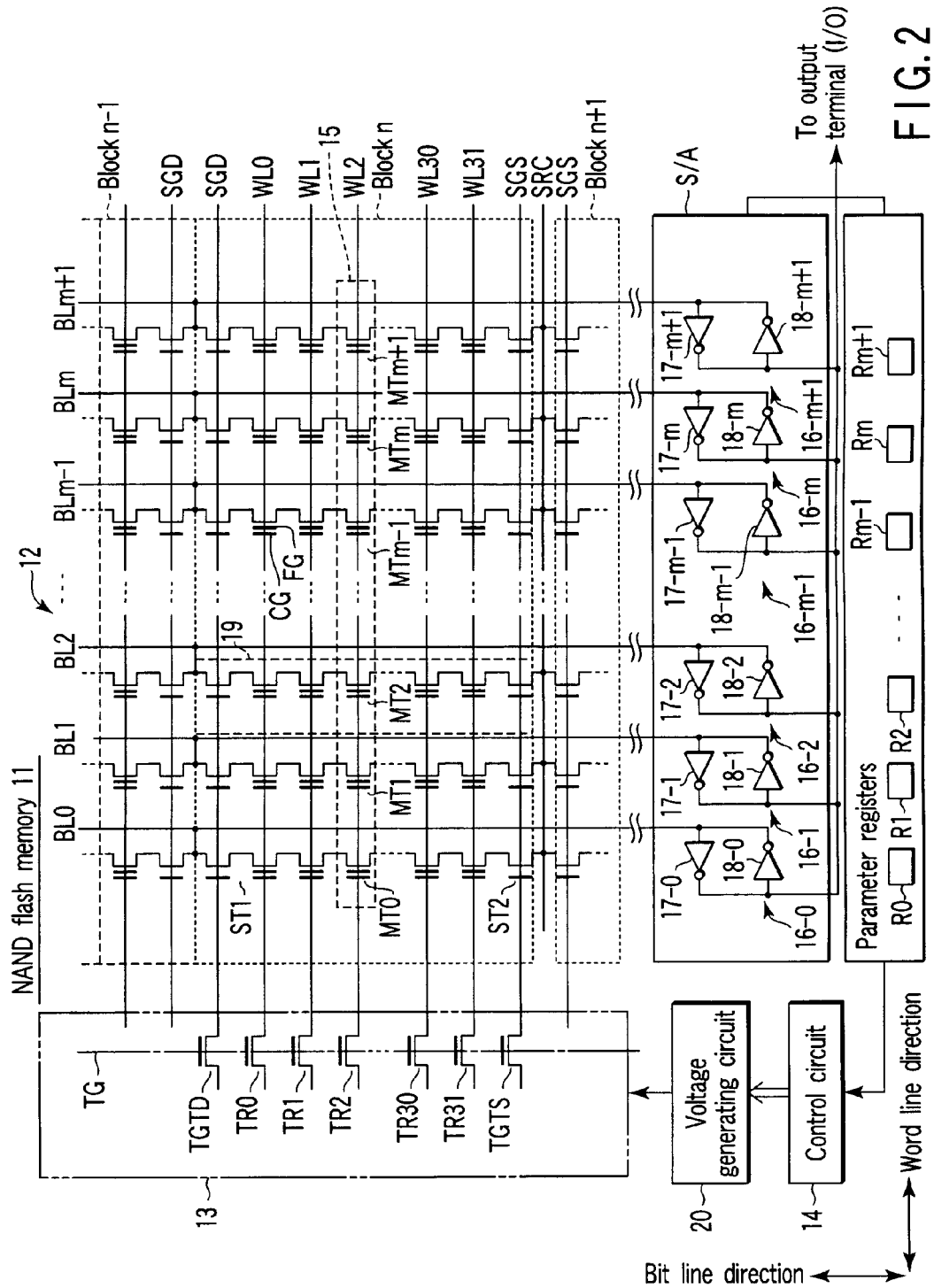
F I G. 2

Unit memory area (page2) : SLC area

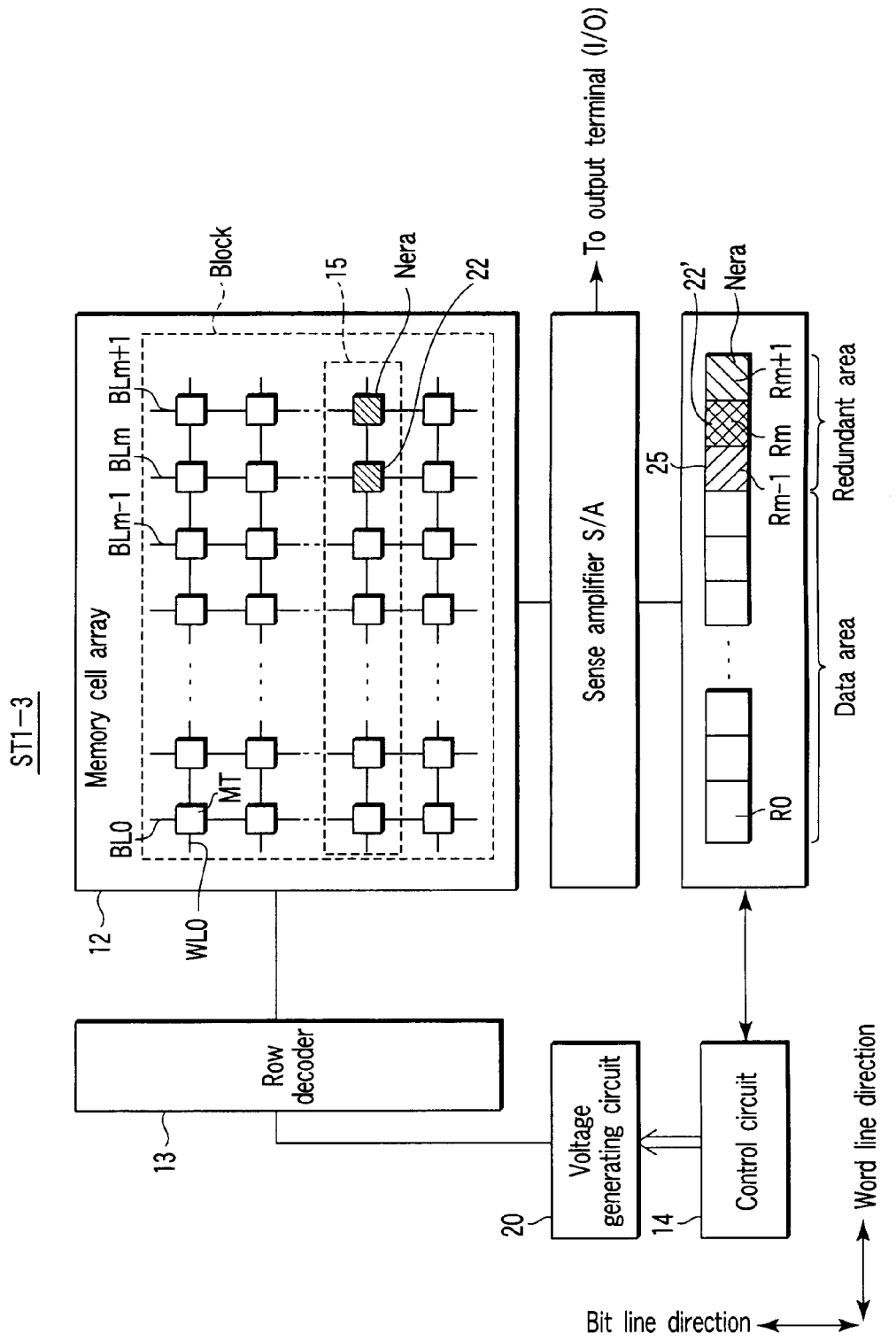
F I G. 9

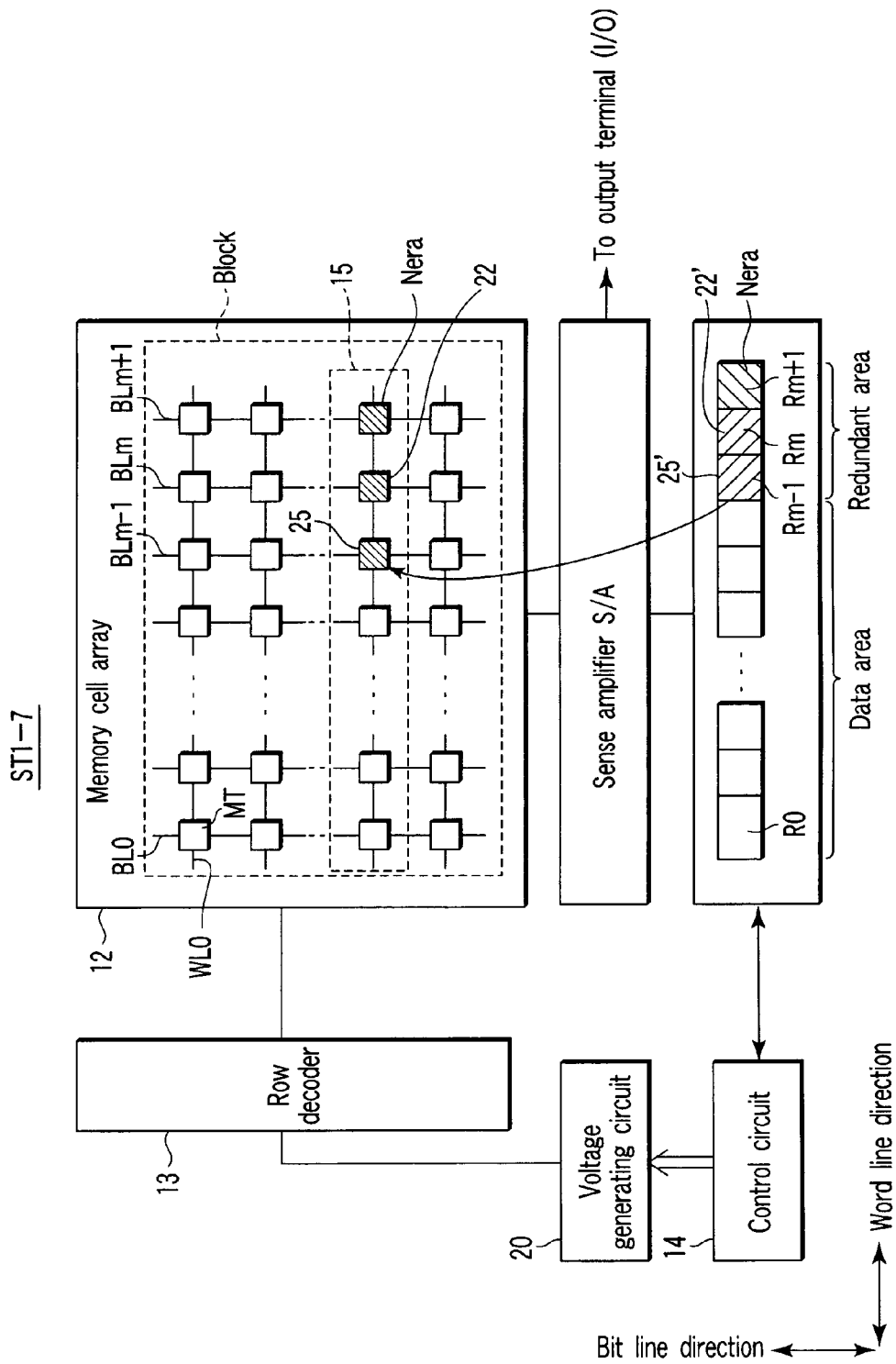
F I G. 11

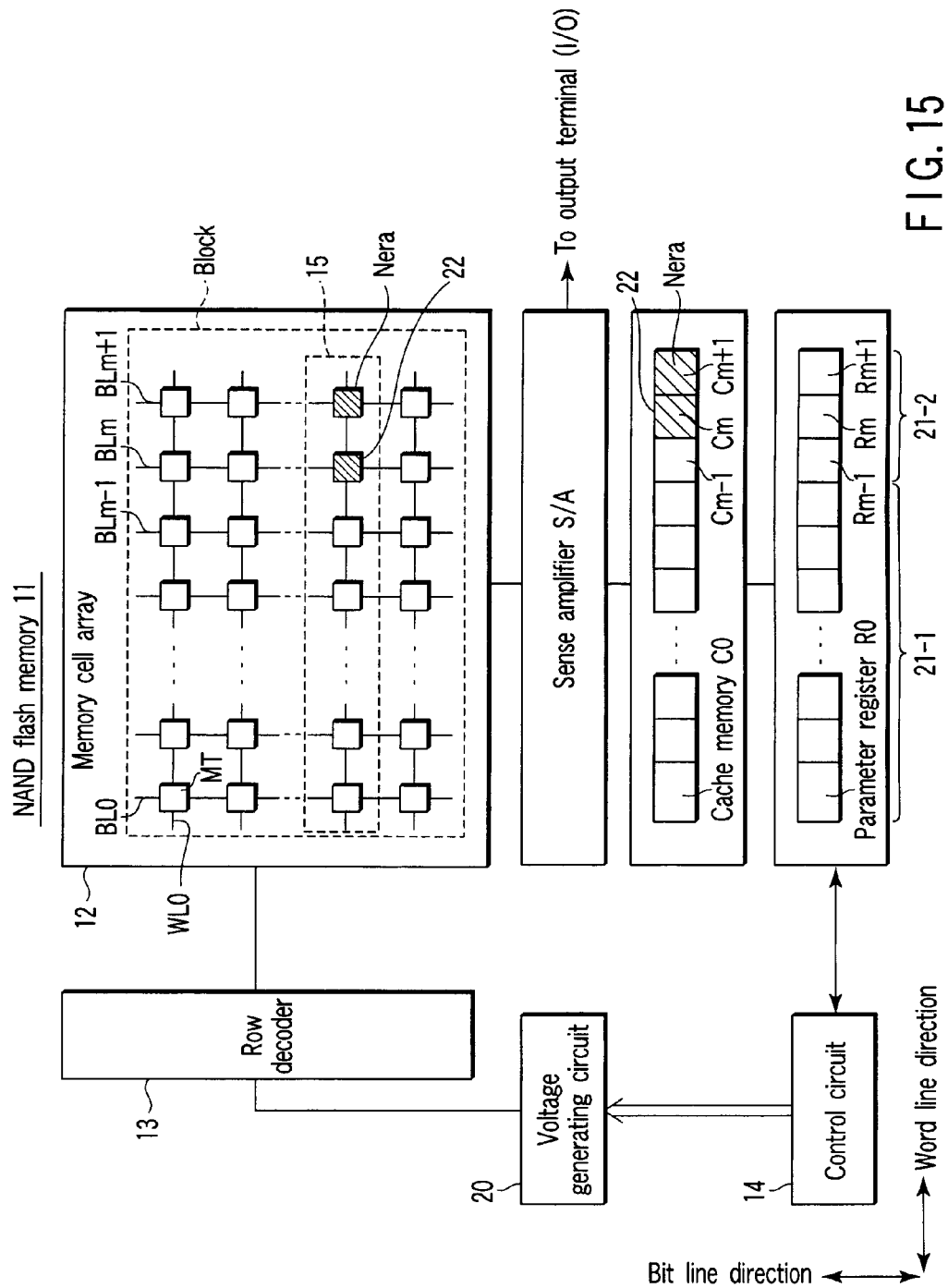
F I G. 15

|  | | Reference pulse number | Sense-time voltage | Bottom shift amount of threshold value distribution |
|---|---|---|---|---|
| For verify | Erase<br>A write<br>B write<br>C write | NeraEV<br>NeraAV } NeraX<br>NeraBV<br>NeraCV | VsenEV<br>VsenAV } VsenX<br>VsenBV<br>VsenCV | VshiftEV<br>VshiftAV } VshiftX<br>VshiftBV<br>VshiftCV |
| For read | Between E-A<br>Between A-B<br>Between B-C | NeraAR<br>NeraBR<br>NeraCR | VsenAR<br>VsenBR<br>VsenCR | VshiftAR<br>VshiftBR<br>VshiftCR |
| For non-selected WL | | NeraU | VsenU | VshiftU |

→ Stored in memory circuit from initial state

| Pulse number |
|---|
| 25 |

Others

→ Pulse number (number of times of pulse application) at erase time

F I G. 21

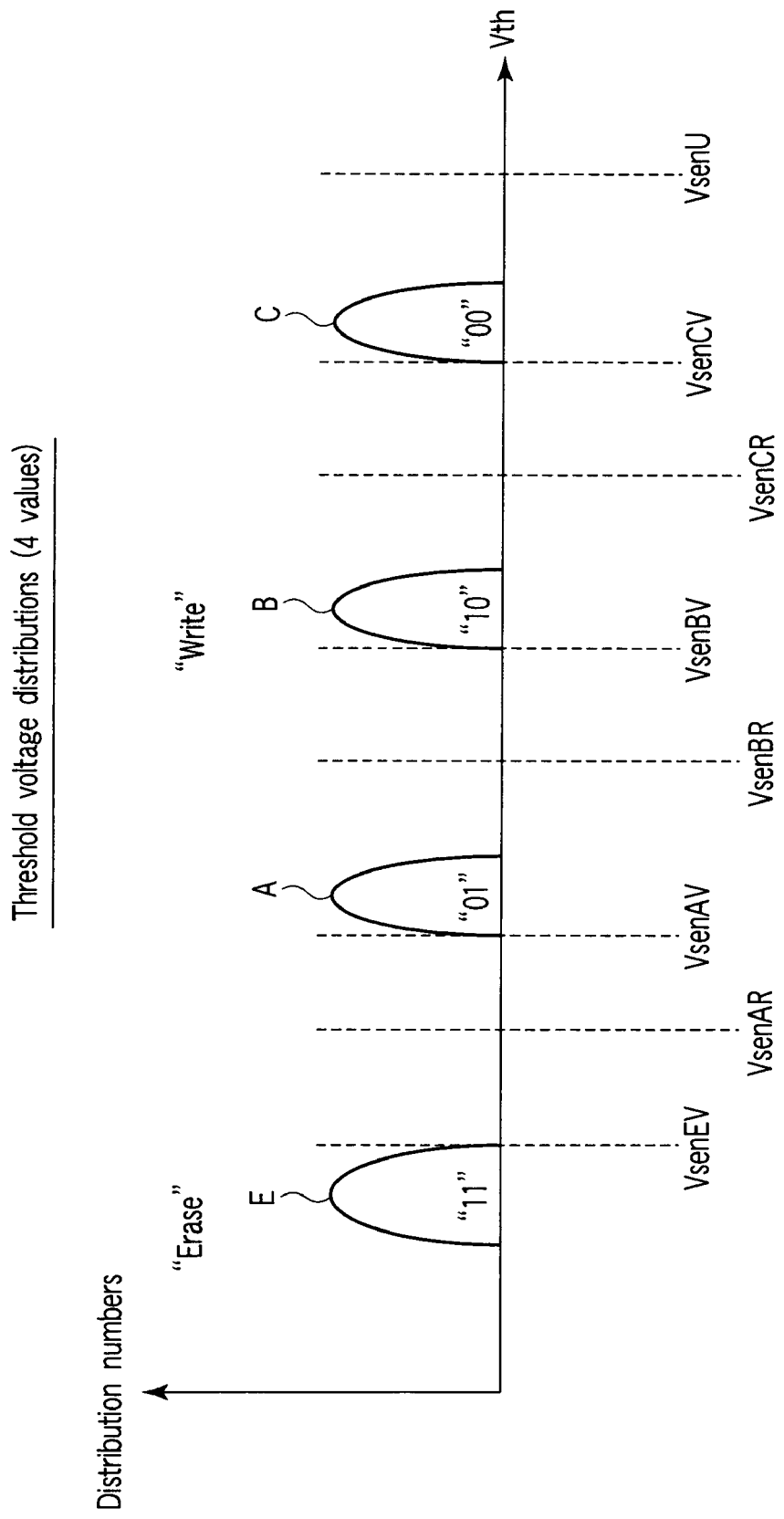
F I G. 22

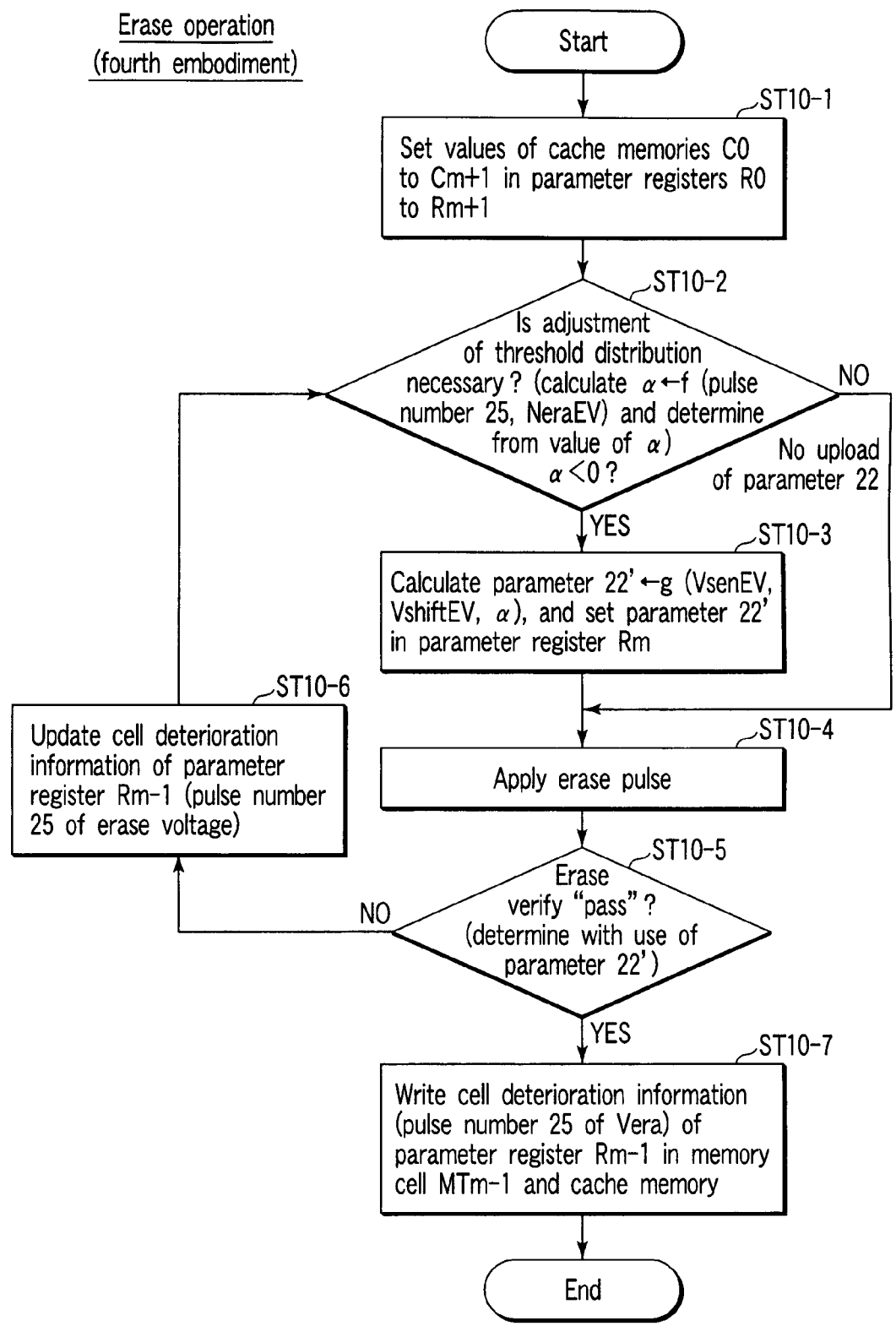
F I G. 31

SEMICONDUCTOR MEMORY DEVICE AND CONTROL METHOD OF THE SAME

CROSS-REFERENCE TO RELATED APPLICATIONS

This application is based upon and claims the benefit of priority from prior Japanese Patent Applications No. 2006-198507, filed Jul. 20, 2006; and No. 2007-135717, filed May 22, 2007, the entire contents of both of which are incorporated herein by reference.

BACKGROUND OF THE INVENTION

1. Field of the Invention

The present invention relates to a semiconductor memory device and a control method of the semiconductor memory device, which are applied to, for instance, a NAND flash memory.

2. Description of the Related Art

In recent years, a demand for nonvolatile memories has been increasing in accordance with an increase in memory capacity thereof. A NAND flash memory is an example of such nonvolatile memories (see, e.g. Jpn. Pat. Appln. KOKAI Publication No. 2004-14043).

It is known, however, that in the memory cells of the NAND flash memory, if write/erase operations for data rewrite are repeated, the characteristics of the memory cells vary and, as a result, the speed of the erase operation becomes lower and the speed of the write operation becomes higher.

For example, at the time of the erase operation, an erase voltage Vera is gradually stepped up, and a plurality of pulses are applied until the erase voltage Vera reaches a target threshold voltage. However, there is a limit to the erase voltage Vera that is to be applied and the number of pulses. Consequently, if the characteristics have varied and the speed of the erase operation has decreased, the threshold voltages of the memory cells do not reach even if the erase voltage Vera reaches its upper limit, and there occurs an erase defect in which the erase operation is not completed.

In addition, the memory cell in which the erase defect has occurred becomes a defective element. Hence, if the number of times of rewrite increases, erase defects occur and the number of defective elements increases.

BRIEF SUMMARY OF THE INVENTION

According to an aspect of the present invention, there is provided a semiconductor memory device comprising: a memory cell array; a voltage generating circuit; a memory circuit which stores a reference pulse number of an erase voltage of the memory cell array and a parameter; and a control circuit which controls, when a pulse number of the erase voltage exceeds the reference pulse number of the erase voltage, the voltage generating circuit in a manner to increase at least an erase verify level in accordance with the parameter.

According to another aspect of the present invention, there is provided a control method of a semiconductor memory device including a memory cell array, a voltage generating circuit, a memory circuit which stores a reference pulse number of an erase voltage of the memory cell array and a parameter, and a control circuit which controls the voltage generating circuit, the method comprising: causing the control circuit to check whether a pulse number of the erase voltage exceeds the reference pulse number of the erase voltage, thereby detecting deterioration information of the memory cell array; changing, if the pulse number of the erase voltage exceeds the reference pulse number of the erase voltage, the parameter in a manner to increase at least an erase verify level; and controlling the voltage generating circuit in a manner to apply the erase voltage to the memory cell array by using the changed parameter, and executing an erase operation.

BRIEF DESCRIPTION OF THE SEVERAL VIEWS OF THE DRAWING

FIG. 2 is a circuit diagram showing the semiconductor memory device according to the first embodiment;

FIG. 9 is a view for explaining an erase operation (step ST1-3) according to the first embodiment;

FIG. 11 is a view for explaining an erase operation (step ST1-7) according to the first embodiment;

FIG. 15 is a block diagram showing a semiconductor memory device according to a second embodiment of the present invention;

FIG. 21 is a view for explaining parameters, etc. which are stored in a memory circuit according to the third embodiment;

FIG. 22 shows threshold voltage distributions (4 values) in the semiconductor memory device according to the third embodiment;

FIG. 31 is a flow chart illustrating an erase operation of a semiconductor memory device according to a fourth embodiment of the invention;

DETAILED DESCRIPTION OF THE INVENTION

Figure 1:
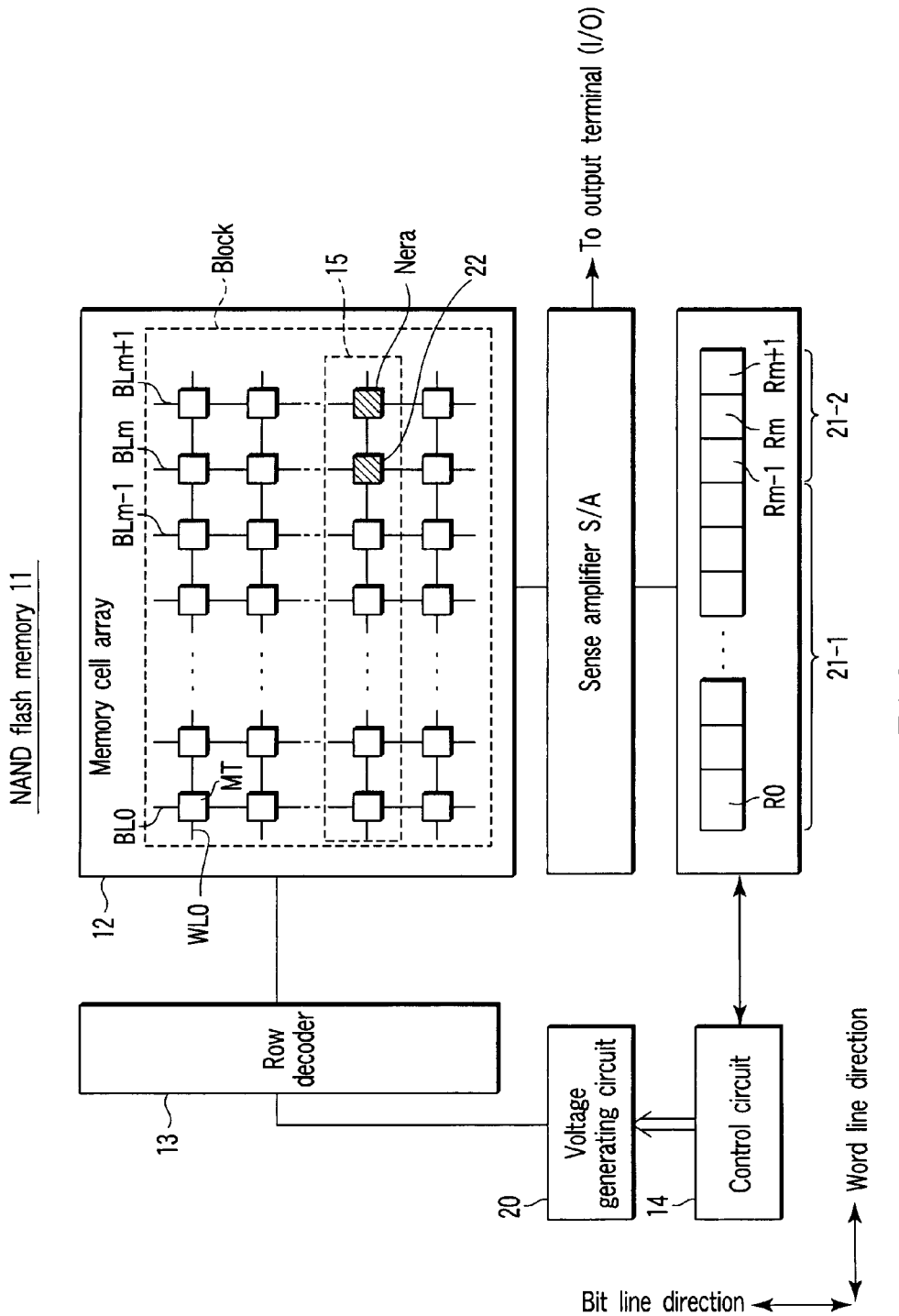
FIG. 1 is a block diagram showing a semiconductor memory device according to a first embodiment of the present invention.

Embodiments of the present invention will now be described with reference to the accompanying drawings.

In the description below, common parts are denoted by like reference numerals throughout the drawings.

FIRST EMBODIMENT

To begin with, referring to FIG. 1 and FIG. 2, a semiconductor memory device according to a first embodiment of the present invention is described. FIG. 1 is a block diagram showing the semiconductor memory device according to this embodiment, and FIG. 2 is a circuit diagram showing the semiconductor memory device according to the embodiment. In this embodiment, a NAND flash memory is described as an example of the semiconductor memory device.

As shown in FIG. 1 and FIG. 2, a NAND flash memory 11 includes a voltage generating circuit 20, a memory cell array 12, a row decoder 13, a sense amplifier S/A, a control circuit 14 and parameter registers R0 to Rm+1.

The voltage generating circuit 20 is configured to generate voltages of predetermined values, for example, a write voltage, an erase voltage and a read voltage.

The memory cell array 12 includes a plurality of Blocks (Block n−1, Block n, Block n+1, . . . ) and a memory circuit 15. In this example, the memory circuit 15 is one page which is a unit memory area (to be described later).

For example, the block (Block n) is a single-level NAND flash memory which is configured as an SLC (Single Level Cell) which is capable of recording 1-bit data in one memory cell transistor MT.

As shown in FIGS. 1 and 2, the block (Block n) includes a plurality of memory cell transistors MT0 to MTm+1, which are arrayed in a matrix at intersections between word lines WL0 to WL31 and bit lines BL0 to BLm+1.

Each of the memory cell transistors MT0 to MTm+1 has a stacked structure comprising a tunnel insulation film provided on a semiconductor substrate; a floating electrode FG provided on the tunnel insulation film, an inter-gate insulation film provided on the floating electrode FG; and a control electrode CG provided on the inter-gate insulation film. Memory cell transistors MT, which neighbor in the direction of the bit line BL, have their sources/drains shared as their current paths. The current paths are connected in series at one end and the other end. In this example, 32 memory cell transistors are connected in series.

A NAND cell column 19 is constituted by the memory cell transistors MT, which have their current paths connected in series at one end and the other end, and select transistors ST1 and ST2. The NAND cell column 19 is selected by the select NAND cell column 19 is connected to the sense transistors ST1 and ST2. One end of the current path of the amplifier S/A, and the other end of the current path is connected to a source line SRC.

The number of memory cell transistors MT is not limited to 32, and may be 8 or 16, for instance. In addition, only one of the select transistors ST1 and ST2 may be provided if the select transistor is configured to select the NAND cell column 19.

The control electrodes CG of the memory cell transistors MT0 to MTm+1 in each row (i.e. in the direction of word line WL) are commonly connected to one of the word lines WL0 to WL31. The gates of the select transistors ST2 are commonly connected to a select gate SGS, and the gates of the select transistors ST1 are commonly connected to a select gate SGD. The source of the select transistor ST2 is connected to a source line SRC, and the drain of the select transistor ST1 is connected to one of the bit lines BL0 to BLm+1.

As indicated by a broken-line box, one page (PAGE) is provided in the direction of the word line WL in association with each of the word lines WL0 to WL31. For example, a page PAGE2 is present in association with the word line WL2. In the block (Block n) that is the SLC area, one page is present in association with each word line WL. Data is written and read in units of a page. An erase operation is performed batchwise in units of the block (Block n).

Another block (Block n−1, Block n+1) may be constituted as a multilevel NAND flash memory which is configured as an MLC (Multi Level Cell) area that is capable of recording multi-bit data in one memory cell transistor MT. In the other structural aspects, the block (Block n−1, Block n+1) is the same as the block (Block n).

The memory circuit 15 is one page (PAGE) which is a unit memory area composed of memory cell transistors MT0 to MTm+1.

Figure 3:
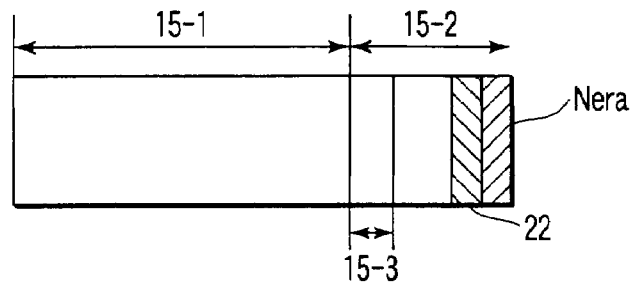
FIG. 3 shows a unit memory area of an SLC area of the semiconductor memory device according to the first embodiment.

For example, PAGE2 in this example has a structure as shown in FIG. 3. As shown in FIG. 3, PAGE2 of the block (Block n) comprises a data area 15-1 (512 Bytes in this example) that stores, data, etc., and a redundant area (16 Bytes) 15-2. The redundant area 15-2 includes an ECC (Error Correcting Code) area 15-3 (3 Bytes), and stores a parameter 22 and a reference pulse number Nera of an erase voltage.

For example, the reference pulse number Nera of the erase voltage (Vera) is 15. The parameter 22 determines, for example, an erase verify level, as will be described later.

The row decoder 13 is configured to select word lines WL0 to WL31 and select gate lines SGD and SGS in accordance with addresses which are designated from a memory controller (not shown). The row decoder 13 includes transfer gate transistors TGTD and TGTS and transfer transistors (high-voltage transistors) TR0 to TR31, which have gates commonly connected to a transfer gate line TG.

The transfer transistors TR0 to TR31 applies predetermined voltages, such as an erase verify level, a read level and write voltage Vpgm, to the control electrodes CG of the memory cell transistors MT.

The sense amplifier S/A is configured to amplify data of each page which is read out of the bit lines BL0 to BLm+1. In this example, the sense amplifier S/A includes a plurality of latch circuits 16-0 to 16-$m$+1, which have inputs connected to the bit lines BL0 to BLm+1 and have outputs connected to an output terminal (I/O).

The latch circuit 16-0 includes inverters 17-0 and 18-0. The input of the inverter 17-0 is connected to the bit line BL0, and the output of the inverter 17-0 is connected to the input of the inverter 18-0. The output of the inverter 18-0 is connected to the output terminal (I/O). The other latch circuits 16-1 to 16-$m$+1 have the same structure.

<Erase Operation>

Next, referring to FIG. 4 to FIG. 10, a description is given of an erase operation, which is an embodiment of a control method of the semiconductor memory device according to the present embodiment. The description of the erase operation is based on a flow chart of FIG. 4.

(Step ST1-1)

Figure 5:
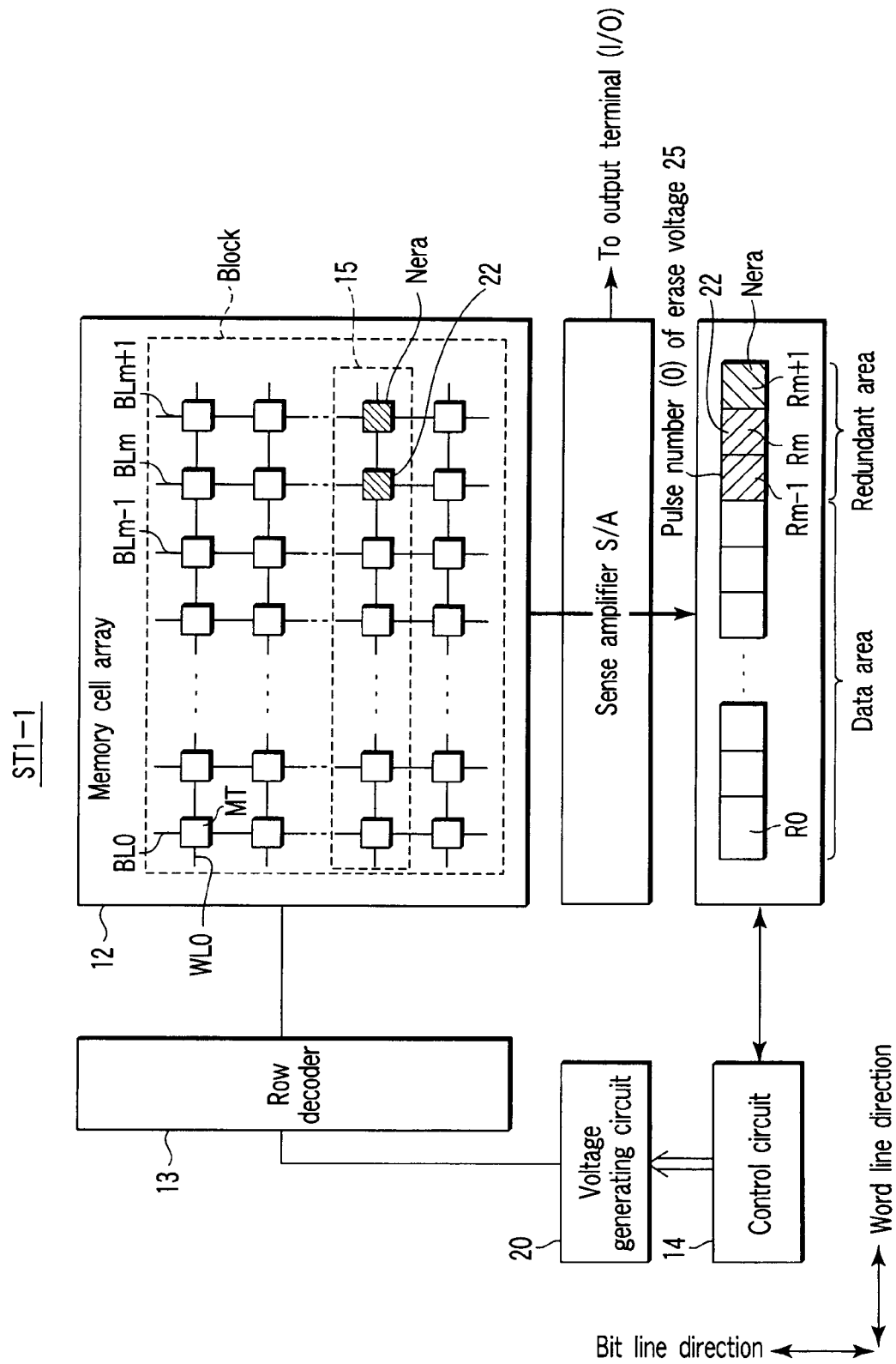
FIG. 5 is a view for describing an erase operation (step ST1-1) according to the first embodiment.

To start with, as shown in FIG. 5, the control circuit 14 reads out the data, which is stored in the memory circuit (page 2 (PAGE2)) 15, by means of the sense amplifier S/A, and sets the read-out data in the associated parameter registers R0 to Rm+1. Thus, the parameter 22 and reference pulse number Nera, which are stored in the memory circuit (PAGE2) 15, are set in the parameter registers R0 and Rm+1, respectively. The reason why the data in the memory circuit 15 are once set in the parameter registers R0 to Rm+1 is that the sense amplifier S/A is prevented from being occupied by the data. If the sense amplifier S/A is occupied, the data read/write/erase operations are disabled. In order to empty the sense amplifier S/A, it is necessary to copy the data to the parameter registers R0 to Rm+1.

At this time, the pulse number 25 of the erase voltage, which is counted and stored in a subsequent step ST1-2, is set at 0 and stored in the parameter register Rm−1.

(Step ST1-2 (Detection of Cell Degradation Information))

Subsequently, the control circuit 14 checks whether a change of the erase verify level is necessary or not, thereby detecting deterioration information of the memory cell MT.

Figure 6:
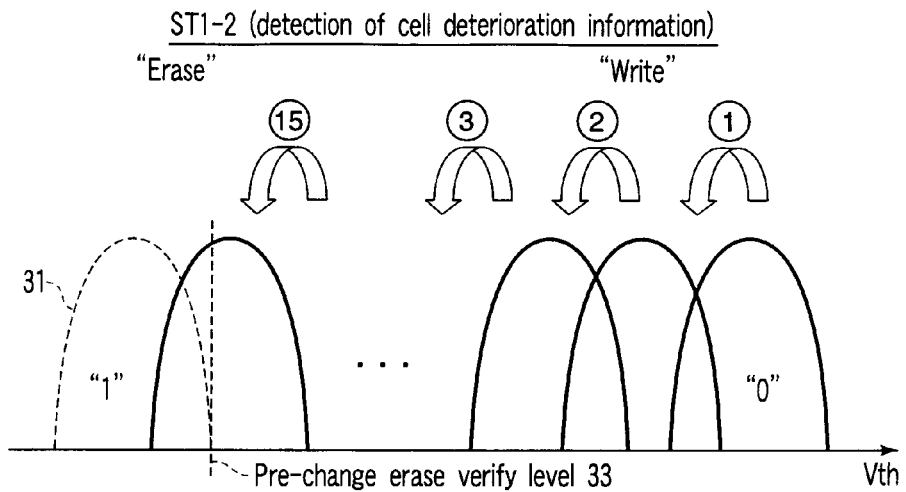
FIG. 6 is a view for describing an erase operation (step ST1-2) according to the first embodiment.

Specifically, as shown in FIG. 6, when erase is executed, by repeatedly applying the erase voltage Vera that is slightly increased from the last applied erase voltage Vera, the threshold voltage distribution is shifted from "0" state to "1" state. However, if the number of times of rewrite of write/erase operations in the memory cell MT (e.g. about $10^6$), the characteristics of the cell MT vary and the speed of the erase operation lowers. Thus, by counting the pulse number of the erase voltage Vera of the cell MT, the deterioration information of the cell MT can be detected on the basis of the fact that the erase in the cell MT has become difficult. Specifically, the control circuit 14 counts the pulse number 25 of the erase voltage Vera, sets the counted pulse number in the parameter register Rm−1, and compares the pulse number with a reference pulse number Nera of the erase voltage Vera that is preset in the parameter register Rm+1.

Specifically, the control circuit 14 checks whether the pulse number 25 of the erase voltage Vera, which is set in the parameter register Rm−1, is greater than the reference pulse number Nera of the erase voltage Vera which is set in the parameter register Rm+1 (the pulse number 25 of Vera>the reference pulse number Nera of Vera?). For example, if the reference pulse number Nera of Vera is 15, the control circuit 14 checks whether the actually counted pulse number 25 of Vera is greater than 15.

(Step ST1-3)

Figure 7:
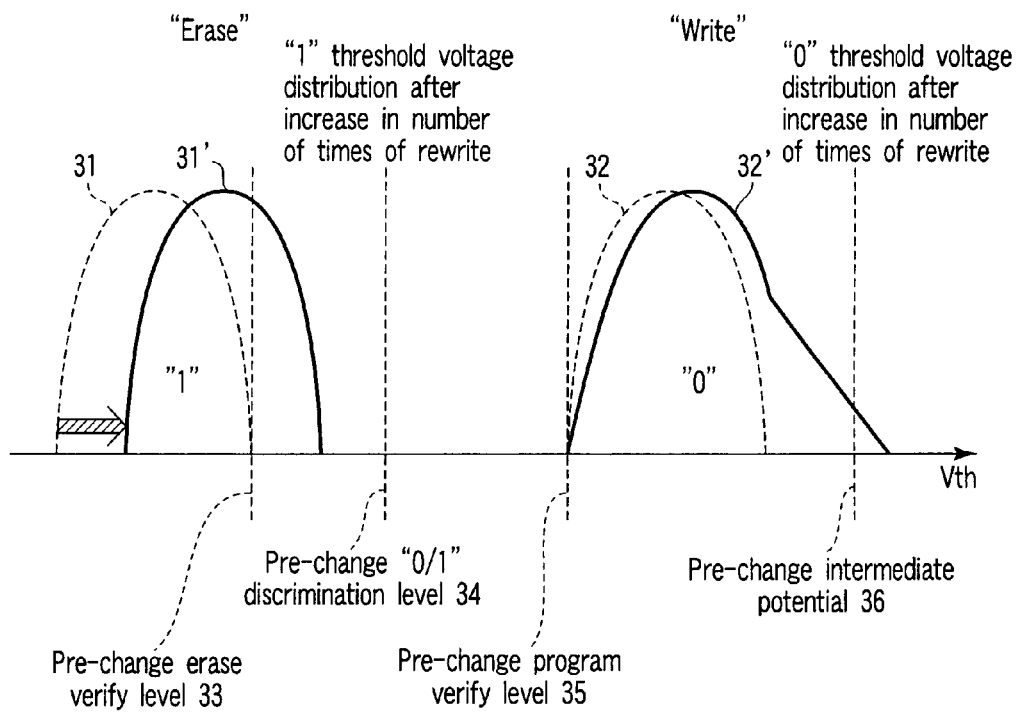
FIG. 7 shows a threshold voltage distribution after an increase in the number of times of rewrite in the semiconductor memory device according to the first embodiment.

Subsequently, as shown in FIG. 7, if the result of the above check shows that a change of the erase verify level 33 is necessary, it can be determined that the number of times of rewrite of the memory cell MT has increased and the memory cell MT has deteriorated. Hence, as shown in FIG. 7, it can be detected that the threshold voltage distributions of "1" and "0" have shifted to the higher voltage side and a bottom portion of the distribution curve has spread ("1" threshold voltage distribution 31→31'; "0" threshold voltage distribution 32→32').

Figure 8:
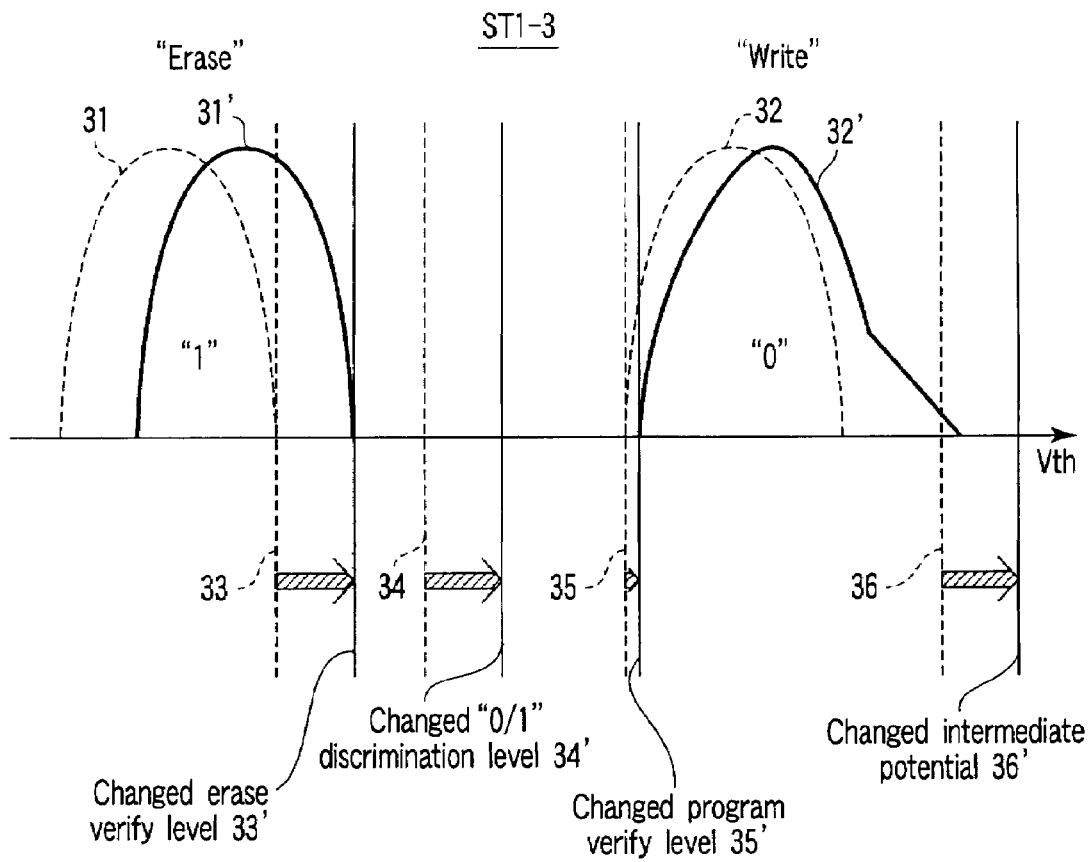
FIG. 8 is a view for explaining an erase operation (step ST1-3) according to the first embodiment.
Figure 4:
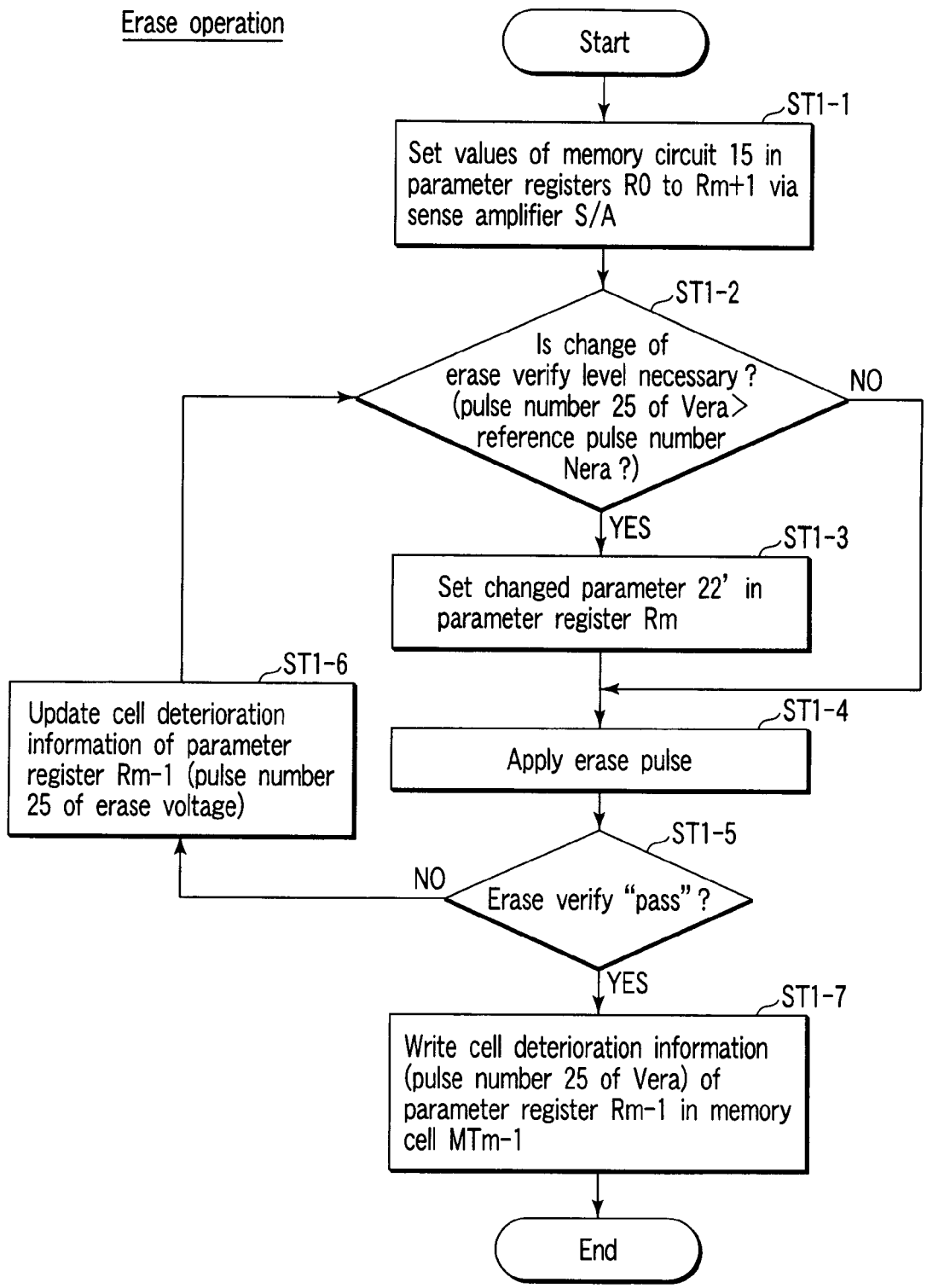
FIG. 4 is a flow chart illustrating an erase operation of the semiconductor memory device according to the first embodiment.

Thus, as shown in FIG. 8 and FIG. 9, the control circuit 14 sets a parameter 22', which is a changed parameter of the parameter 22, in the parameter register Rm, for instance, so as to increase the values of the erase verify level 33, "0"/"1" discrimination level 34, program verify level 35 and intermediate potential 36 (i.e. so as to shift these values to the higher voltage side).

The "0"/"1" discrimination level 34, 34' is a read potential level. The intermediate potential 36, 36' is the level of potential that is applied to a non-selected cell at a time of a read operation.

(Step ST1-4)

If the result of the above check shows that the change of the erase verify level 33 is not necessary (if the memory cell MT has not deteriorated), the control circuit 14 controls the voltage generating circuit 20 so as to apply the erase pulse to a predetermined block (Block n) in the memory cell array 12 with the previously set parameter 22.

On the other hand, if the change of the erase verify level 33 is necessary (if the memory cell MT has deteriorated), the control circuit 14 controls the voltage generating circuit 20 by using the parameter 22' for increasing the values of the erase verify level 33, etc. Accordingly, the control circuit 14 controls the voltage generating circuit 20 so that the erase verify level 33 may shift to the changed erase verify level 33'.

(Step ST1-5)

Subsequently, the control circuit 14 checks whether the pass of the erase verify level 33 is enabled or not. Specifically, the control circuit 14 applies the voltage of the erase verify level to the word line WL, and checks whether a predetermined memory cell MT has been erased or not.

(Step ST1-6)

Figure 10:
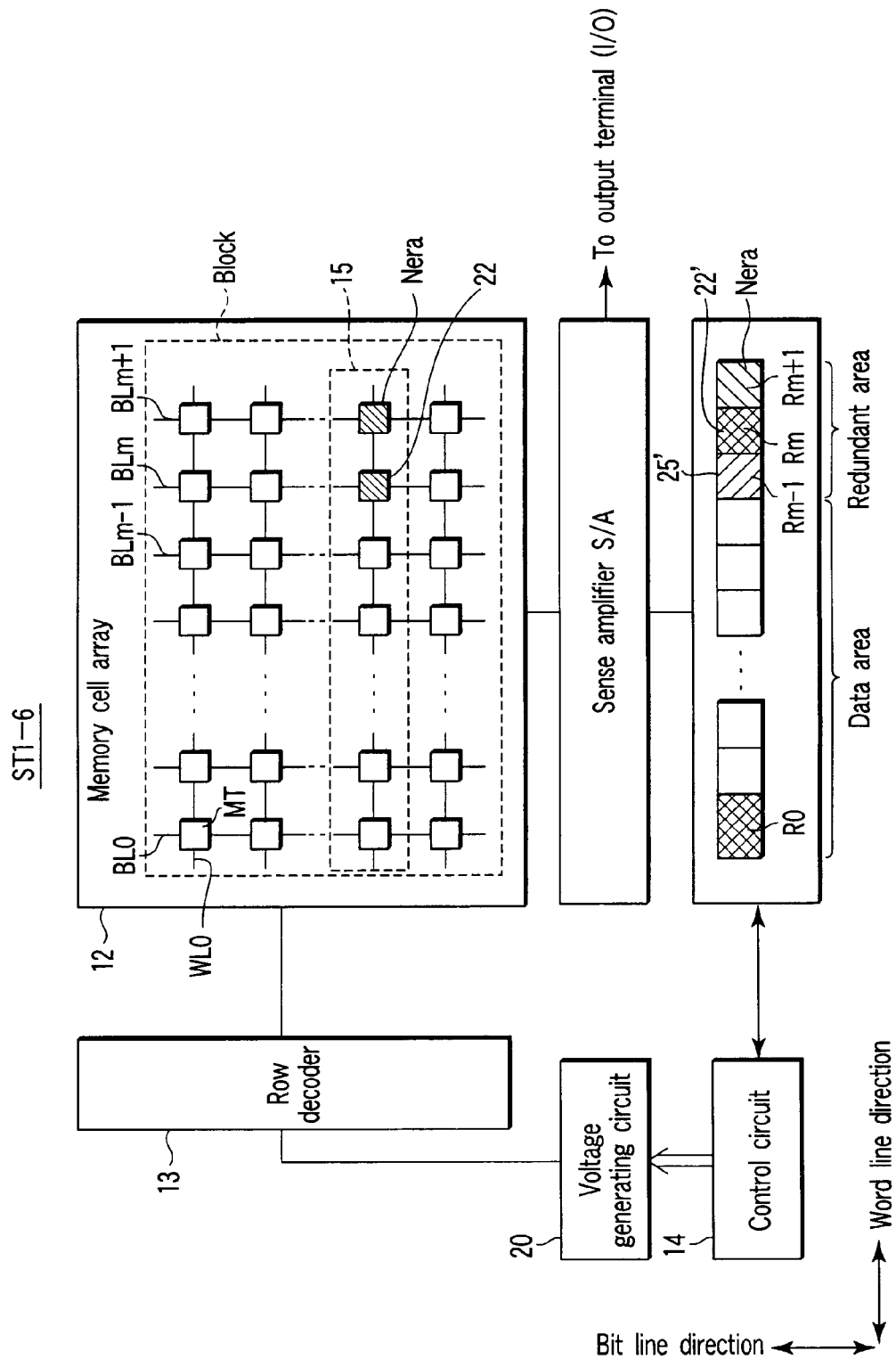
FIG. 10 is a view for explaining an erase operation (step ST1-6) according to the first embodiment.

Then, as shown in FIG. 10, if the result of the above check shows that the pass of the erase verify level 33 is not enabled, the control circuit 14 sets the actually counted, updated pulse number 25' of the erase voltage in the parameter register Rm−1. The control circuit 14 compares once again the updated pulse number 25' of the erase voltage with the reference number Nera of the erase voltage, thereby checking whether a change of the erase verify level is necessary or not (step ST1-2).

(Step ST1-7)

Subsequently, as shown in FIG. 11, if the result of the above check shows that the pass of the erase verify level 33 is enabled, the control circuit 14 writes the pulse number 25 of the erase voltage Vera, which is set in the parameter register Rm−1, in the memory cell MTm−1.

Subsequently, the same steps ST1-1 to ST1-7 are repeated, and the erase operation of the semiconductor memory device according to the present embodiment is executed.

<Read Operation>

Figure 12:
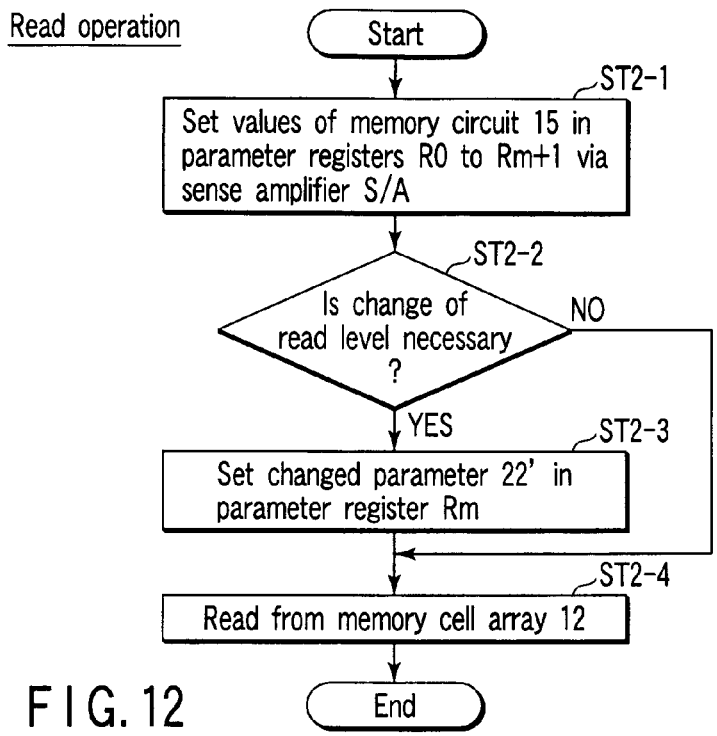
FIG. 12 is a flow chart illustrating a read operation of the semiconductor memory device according to the first embodiment.

Next, referring to FIG. 12, a description is given of a read operation, which is an embodiment of the control method of the semiconductor memory device according to the present embodiment. The description of the read operation is based on the flow chart of FIG. 12.

(Step ST2-1)

To start with, the control circuit 14 reads out values of the page 2 (PAGE2), which is the memory circuit 15, by means of the sense amplifier S/A, and sets the read-out values in the associated parameter registers R0 to Rm+1.

(Step ST2-2)

Subsequently, the control circuit 14 checks whether a change of the read level is necessary or not, by using the set deterioration information (pulse number Nera, parameter 22).

As shown in FIG. 8, if the number of times of rewrite of write/erase operations increases, the threshold voltage distributions 31', 32' corresponding to "1" and "0" shift to the higher voltage side and a bottom portion of the distribution curve spreads. Hence, it is also necessary to shift the read level to the higher voltage side.

The control circuit 14 thus checks whether the change of the read level is necessary or not, on the basis of whether the parameter 22 is changed or not.

(Step ST2-3)

If the result of the above check shows that the change of the read level is necessary, the control circuit 14 changes the read parameter 22 and sets the changed read parameter 22' (the erase verify level 33', "0"/"1" discrimination level 34', program verify level 35' and intermediate potential 36') in the parameter register Rm, for instance.

(Step ST2-4)

If the result of the above check shows that the change of the read level is not necessary, the control circuit 14 controls the voltage generating circuit 20 so as to execute data read of a predetermined page in the memory cell array 12 with the pre-change read parameter 22 (the erase verify level 33, "0"/"1" discrimination level 34, program verify level 35 and intermediate potential 36).

On the other hand, if the change of the read level is necessary, the control circuit 14 controls the voltage generating circuit 20 so as to execute data read of a predetermined page in the memory cell array 12 with the changed read parameter 22' (the erase verify level 33', "0"/"1" discrimination level 34', program verify level 35' and intermediate potential 36').

Subsequently, the same steps ST2-1 to ST2-4 are repeated, and the read operation of the semiconductor memory device according to the present embodiment is executed. By the read operation of this embodiment, the data in a predetermined page can be read, either before or after the change of the read level.

<Write Operation>

Figure 13:
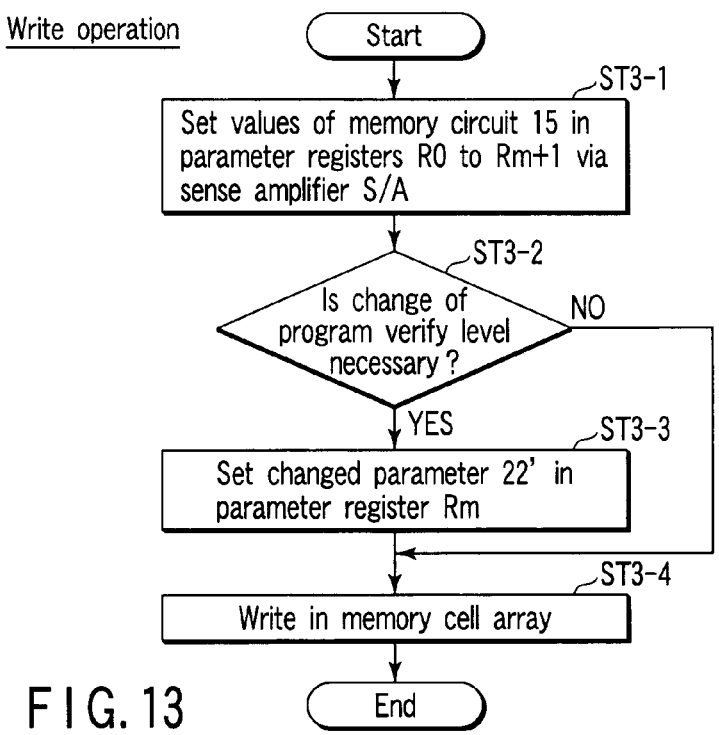
FIG. 13 is a flow chart illustrating a write operation of the semiconductor memory device according to the first embodiment.
Figure 14:
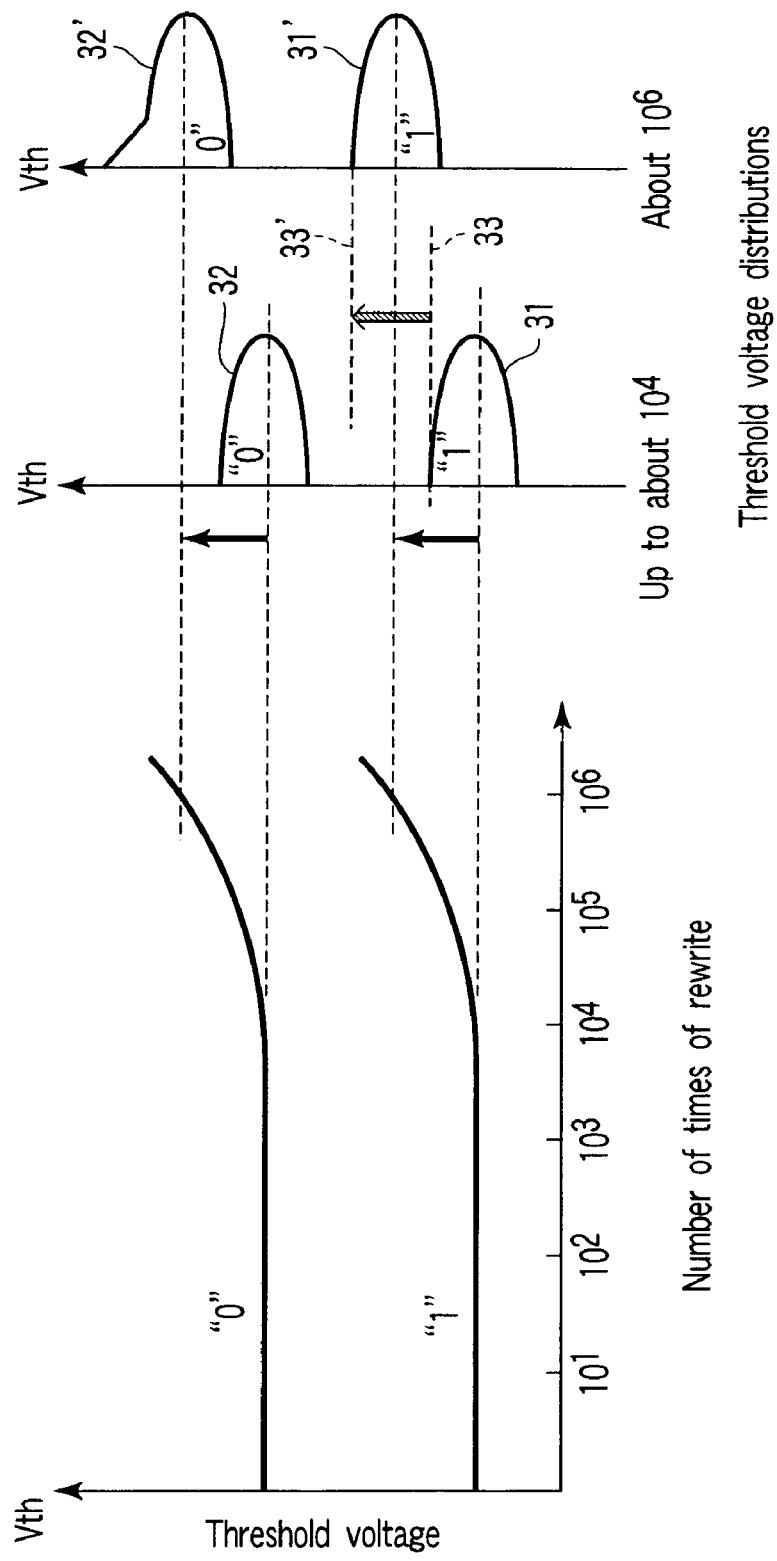
FIG. 14 is a view for explaining an advantageous effect of the semiconductor memory device according to the first embodiment.

Next, referring to FIG. 13, a description is given of a write operation, which is an embodiment of the control method of the semiconductor memory device according to the present embodiment. The description of the write operation is based on the flow chart of FIG. 13.

(Step ST3-1)

To start with, the control circuit 14 reads out values of the page 2 (PAGE2), which is the memory circuit 15, by means of the sense amplifier S/A, and sets the read-out values in the associated parameter registers R0 to Rm+1.

(Step ST3-2)

Subsequently, the control circuit 14 checks whether a change of the program verify level 35 is necessary or not.

As shown in FIG. 8, if the number of times of rewrite of write/erase operations increases, the threshold voltage distributions 31', 32' corresponding to "1" and "0" shift to the higher voltage side and a bottom portion of the distribution curve spreads. Hence, it is also necessary to shift the program verify level 35 to the higher voltage side.

The control circuit 14 thus checks whether the change of the program verify level is necessary or not, on the basis of whether the parameter 22 is changed or not.

(Step ST3-3)

If the result of the above check shows that the change of the program verify level 35 is necessary, the control circuit 14 changes the parameter 22 and sets the changed read parameter 22' (the erase verify level 33', "0"/"1" discrimination level 34', program verify level 35' and intermediate potential 36') in the parameter register Rm, for instance.

(Step ST3-4)

If the result of the above check shows that the change of the program verify level 35 is not necessary, the control circuit 14 controls the voltage generating circuit 20 so as to execute data write in a predetermined page in the memory cell array 12 with the pre-change read parameter 22 (the erase verify level 33, "0"/"1" discrimination level 34, program verify level 35 and intermediate potential 36).

On the other hand, if the change of the program verify level 35 is necessary, the control circuit 14 controls the voltage generating circuit 20 so as to execute data write in a predetermined page in the memory cell array 12 with the changed read parameter 22' (the erase verify level 33', "0"/"1" discrimination level 34', program verify level 35' and intermediate potential 36').

Subsequently, the same steps ST3-1 to ST3-4 are repeated, and the write operation of the semiconductor memory device according to the present embodiment is executed. By the write operation of this embodiment, data write can be executed in a predetermined page, either before or after the change of the program verify level.

At least the following advantageous effects (1) to (4) can be obtained by the semiconductor memory device and the control method thereof according to the present embodiment.

(1) Even if the number of times of rewrite increases, the occurrence of erasure defects can be prevented and the number of defective elements can be reduced.

In the semiconductor memory device according to the present embodiment, the reference pulse number Nera of the erasure voltage is stored in the memory cell transistor MTm+1.

When the erasure operation is executed, the control circuit 14 checks whether the pulse number 25 of the erasure voltage Vera, which is set in the parameter register Rm−1, is greater than the reference pulse number Nera of the erasure voltage Vera, which is set in the parameter register Rm+1 (pulse number 25>reference pulse number Nera?) (step ST1-2). By the check, the deterioration information of the memory cell transistor MT can be detected.

Subsequently, the control circuit 14 sets the parameter 22', which becomes the erase verify level 33' that is changed in a manner to increase the value of the erase verify level 33 (i.e. in a manner to shift the value to the higher voltage side), in the parameter register Rm, for instance (step ST1-3). Thereafter, the control circuit 14 controls the voltage generating circuit 20 so as to make a shift to the erase verify level 33' by using the parameter 22', thus executing the erasure operation.

Thereby, the occurrence of an erasure defect can be prevented even if the number of times of rewrite has increased to about $10^6$ and the threshold voltage distribution of the memory cell transistor MT has shifted to the higher value side. As a result, a defective element in the prior art, in which an erasure defect has occurred, can be remedied, and the number of defective elements can be reduced.

(2) Even if the number of times of rewrite has increased, erroneous read can be prevented.

As has been described above, when the read operation is executed, the control circuit 14 checks whether the change of the read level is necessary or not, on the basis of whether the parameter 22 has been changed or not (step ST2-2). Subsequently, if the change of the read level is necessary, the control circuit 14 controls the voltage generating circuit 20 so as to execute data read of a predetermined page in the memory cell array 12 by using the changed parameter 22' (the erase verify level 33', "0"/"1" discrimination level 34', program verify level 35' and intermediate potential 36'). Thus, the read operation can be executed.

As described above, even in the case where the number of times of rewrite has increased and the threshold voltage distribution of the memory cell transistor MT has shifted to the higher value side, the control circuit 14 can detect deterioration information of the cell in the above-described step ST2-2.

Further, the control circuit 14 executes the read operation by using the changed parameter 22'. Thereby, in accordance with the deterioration state of the cell MT, the control circuit 14 can execute the read operation by using the "0"/"1" discrimination level 34' and intermediate potential 36' which are obtained by shifting the values of the "0"/"1" discrimination level 34 and intermediate potential 36 to the higher voltage side.

Hence, even if the number of times of rewrite has increased (e.g. about $10^6$), erroneously read can be prevented.

(3) Even if the number of times of rewrite increases, over-program can be prevented and the number of defective elements can be reduced.

As has been described above, when the write operation is executed, the control circuit 14 checks whether the change of the program verify level is necessary or not, on the basis of whether the parameter 22 has been changed or not (step ST3-2). Subsequently, if the result of the check shows that the change of the program verify level 35 is necessary, the control circuit 14 changes the parameter 22 and sets the changed parameter 22' (the erase verify level 33', "0"/"1" discrimination level 34', program verify level 35' and intermediate potential 36') in the parameter register R0, for instance (step ST3-3).

As described above, even in the case where the number of times of rewrite has increased and the threshold voltage distribution of the memory cell transistor MT has shifted to the higher value side, the control circuit 14 can detect deterioration information of the cell in the above-described step ST3-2.

Moreover, the control circuit 14 executes the write operation by using the changed parameter 22'. Thereby, in accordance with the deterioration state of the cell MT, the control circuit 14 can execute the write operation by using the program verify level 35', which is obtained by shifting the program verify level 35 to the higher voltage side.

If the number of times of rewrite of the cell increases, the speed of data write in the cell becomes higher. Consequently, the number of pulses, which is necessary to reach a target threshold voltage, decreases, and over-program occurs. A cell, in which such over-program has occurred, becomes a defective element.

The above-described control circuit 14, however, can detect deterioration information of the cell in the above-described check (step ST3-2), and can execute the write operation, if necessary, by using the program verify level 35' which has been shifted to the higher voltage side.

Therefore, even if the number of times of rewrite increases (e.g. about $10^6$), over-program can be prevented and the number of defective elements can be reduced.

(4) The erase operation, for instance, can be executed in accordance with the deterioration state of the cell MT after mounting.

In the case of the present embodiment, data write and erase can electrically be executed in the memory cell transistors MT0 to MTm+1 which constitute the memory circuit 15.

Thus, even after the NAND flash memory 11 is mounted, the reference pulse number Nera of the erase voltage Vera and the value of the parameter 22 can be varied by re-programming (step ST1-7). As a result, the erase operation, for instance, can be executed in accordance with the deterioration state of the cell MT after mounting.

In the case of the present embodiment, the memory circuit 15, which stores the parameter 22 that is deterioration information and the reference pulse number Nera of erase voltage, is provided in association with each of the blocks. Therefore, the erase operation, for instance, can advantageously be executed in accordance with the deterioration state of each block.

SECOND EMBODIMENT

Example Including a Cache Memory

Next, a semiconductor memory device according to a second embodiment of the invention is described with reference to FIG. 15. The second embodiment relates to an example in which a cache memory is further included. In the description below, a detailed description of the parts common to those in the first embodiment is omitted.

As shown in FIG. 15, the semiconductor memory device of the second embodiment differs from that of the first embodiment in that the semiconductor memory device further includes cache memories C0 to Cm+1 which have inputs connected to the sense amplifier S/A and have outputs connected to the parameter registers R0 to Rm+1. For example, an SRAM (Static Random-Access Memory) is applied to each of the cache memories C0 to Cm+1.

The parameter 22, etc. in the memory circuit 15 are read out batchwise in advance via the sense amplifier S/A into the cache memories C0 to Cm+1, for example, when power is turned on (power-on operation time). For example, at the power-on operation time, the parameter 22 and the reference pulse number Nera of the erase voltage are read out to the cache memories Cm and Cm+1.

<Erase Operation>

Figure 16:
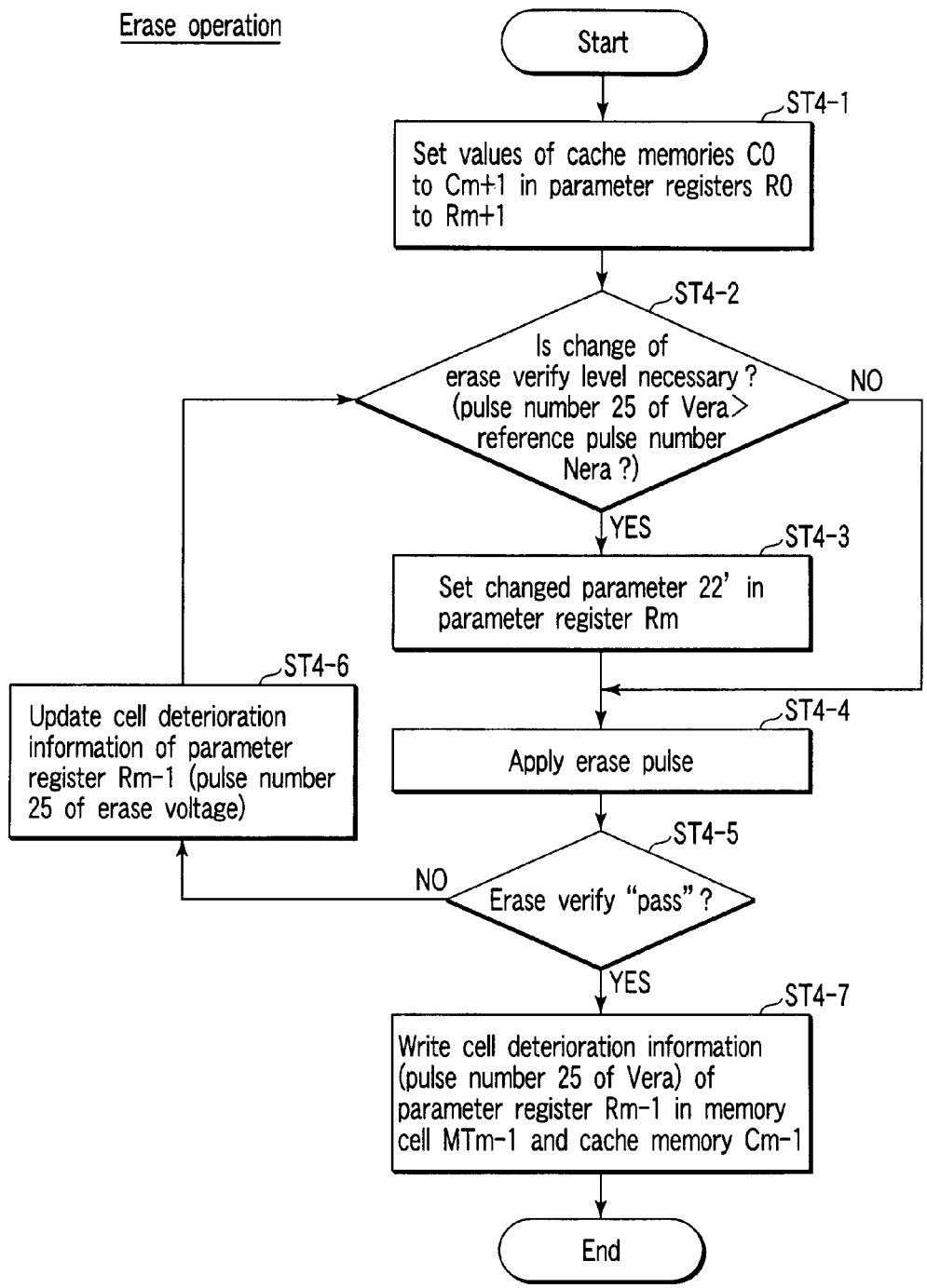
FIG. 16 is a flow chart illustrating an erase operation of the semiconductor memory device according to the second embodiment.

Next, referring to FIG. 16, a description is given of an erase operation, which is an embodiment of a control method of the semiconductor memory device according to the present embodiment.

(Step ST4-1)

To start with, the control circuit 14 sets the data, which have been read out to the cache memories C0 to Cm+1, in the associated parameter registers R0 to Rm+1. For example, the parameter 22 that is stored in the cache memory Cm and the reference pulse number Nera that is stored in the cache memory Cm+1 are set in the associated parameter registers R0 and Rm+1.

The reason why the control circuit 14 can immediately set the parameter 22, etc. in the parameter registers R0 to Rm+1 at the time of the erase operation is that the parameter 22, etc. in the memory circuit 15 have been read out batchwise in advance into the cache memories C0 to Cm+1 at the time of the power-on operation.

Subsequently, the same steps ST4-2 to ST4-6 of the erase operation as in the first embodiment are executed.

(Step ST4-7)

Then, if the result of the above-described check shows that the pass of the erase verify level is enabled, the control circuit 14 writes the pulse number 25 of the erase voltage Vera, which is set in the parameter register Rm−1, in the memory cell MTm−1 and the cache memory Cm−1.

As described above, the steps ST4-1 to ST4-7 are performed, and the erase operation of this embodiment can be executed.

<Read Operation>

Figure 17:
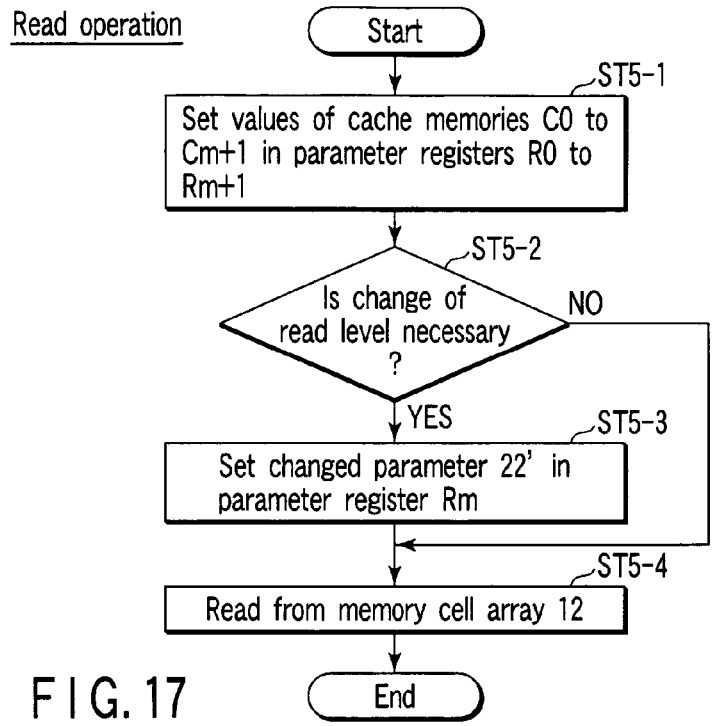
FIG. 17 is a flow chart illustrating a read operation of the semiconductor memory device according to the second embodiment.

Next, referring to FIG. 17, a description is given of a read operation, which is an embodiment of the control method of the semiconductor memory device according to the present embodiment.

(Step ST5-1)

To start with, the control circuit 14 sets the data, which have been read out to the cache memories C0 to Cm+1, in the associated parameter registers R0 to Rm+1. For example, the parameter 22 that is stored in the cache memory C0 and the reference pulse number Nera that is stored in the cache memory Cm+1 are set in the associated parameter registers R0 and Rm+1.

The reason why the control circuit 14 can immediately set the parameter 22, etc. in the parameter registers R0 to Rm+1 at the time of the read operation is that the parameter 22, etc. in the memory circuit 15 have been read out batchwise in advance into the cache memories C0 to Cm+1 at the time of the power-on operation.

Subsequently, the same steps ST5-2 to ST5-4 of the read operation as in the first embodiment are executed, and the read operation of the present embodiment is carried out.

<Write Operation>

Figure 18:
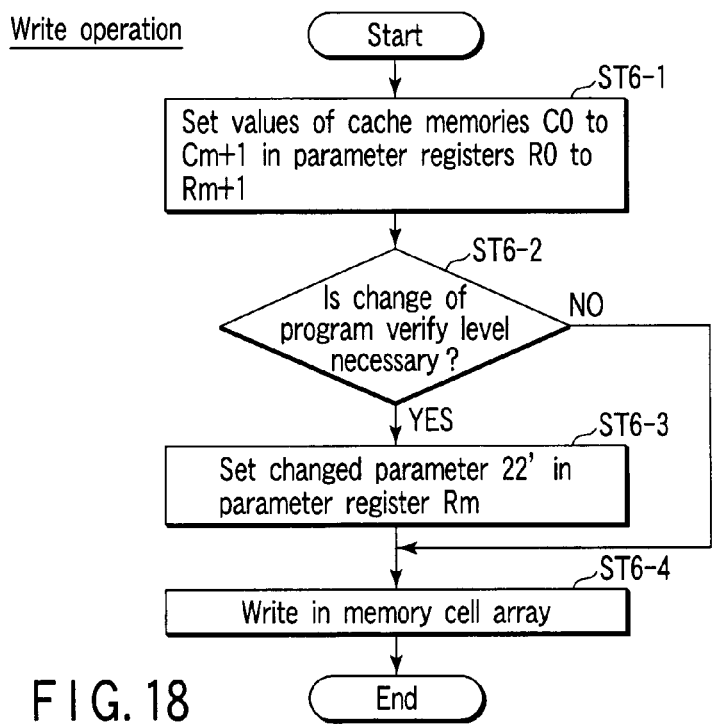
FIG. 18 is a flow chart illustrating a write operation of the semiconductor memory device according to the second embodiment.

Next, referring to FIG. 18, a description is given of a write operation, which is an embodiment of the control method of the semiconductor memory device according to the present embodiment.

(Step ST6-1)

To start with, the control circuit 14 sets the data, which have been read out to the cache memories C0 to Cm+1, in the associated parameter registers R0 to Rm+1. For example, the parameter 22 that is stored in the cache memory C0 and the reference pulse number Nera that is stored in the cache memory Cm+1 are set in the associated parameter registers R0 and Rm+1.

The reason why the control circuit 14 can immediately set the parameter 22, etc. in the parameter registers R0 to Rm+1 at the time of the write operation is the same as described above in connection with the erase operation and the read operation.

Subsequently, the same steps ST6-2 to ST6-4 of the write operation as in the first embodiment are executed, and the write operation of the present embodiment is carried out.

As described above, according to the present embodiment, the same advantageous effects as the above-described (1) to (4) can be obtained. Furthermore, the following advantageous effect (5) is obtained.

(5) A high-speed operation can advantageously be performed.

As described above, the semiconductor memory device of this embodiment includes the cache memories C0 to Cm+1. In addition, the control circuit 14 reads out batchwise the data, such as parameter 22, which are stored in the memory circuit 15, into the cache memories C0 to Cm+1 in advance.

Thus, there is no need to perform the step of reading out the parameter 22, etc. from the memory circuit 15 of the memory cell array 12 each time the above-described erase, read or write operation is executed. Therefore, the speed of the overall operation of the NAND flash memory 11 can advantageously be increased.

The cache memories C0 to Cm+1 are composed of, e.g. SRAMs which can operate at high speed. Therefore, high-speed access can advantageously be executed.

The structure and operation of the present embodiment can be applied, as needed.

In the first and second embodiments, the block (Block n), which is the SLC area, has been described by way of example. However, the invention is similarly applicable to other blocks (Block n−1 and Block n+1), which are MLC areas, and the same advantageous effects can be obtained. One page, which is a unit memory area in this case, is represented, for example, as shown in FIG. 19.

Figure 19:
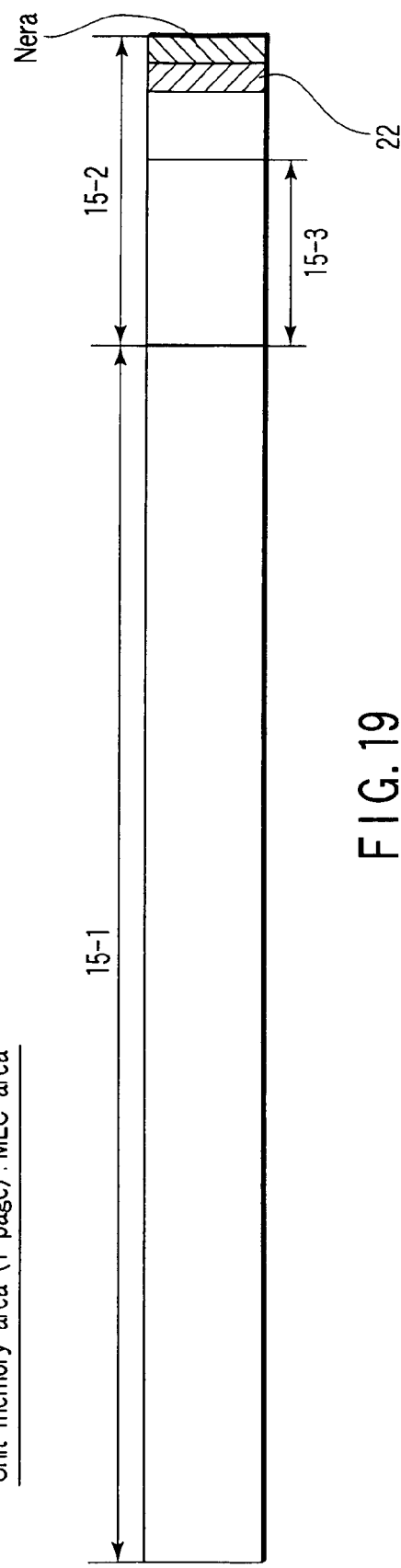
FIG. 19 shows a unit memory area of an MLC area of a semiconductor memory device according to another example of the invention.

As shown in FIG. 19, the ratio of occupation of the error correcting code 15-3 in the redundant area 15-2 of the MLC area (about 60% in this embodiment) is set to be greater than the ratio of occupation of the error correcting code 15-3 in the redundant area 15-2 of the SLC area in FIG. 3 (about 20% in FIG. 3). Thus, in this embodiment, the ratio of the error correcting code area in the MLC area is about three times greater than the ratio of the error correcting code area in the SLC area.

In the above description, the memory circuit 15 is provided in association with each block (Block) by way of example. However, the memory circuit 15 may be provided in association with each page. In this case, the write operation, etc. can advantageously be performed in accordance with a more detailed deterioration state of the cell in each page.

THIRD EMBODIMENT

Example of Multilevel NAND Flash Memory

Next, referring to FIG. 20 to FIG. 30, a semiconductor memory device according to a third embodiment is described. This embodiment relates to an example in which the invention is applied to a multilevel NAND flash memory which is capable of storing multi-bit data in one memory cell. In the description below, a detailed description of the parts common to those in the first embodiment is omitted. In the present embodiment, a 4-value multilevel NAND flash memory is described as an example of the multilevel NAND flash memory.

<Example of Structure>

Figure 20:
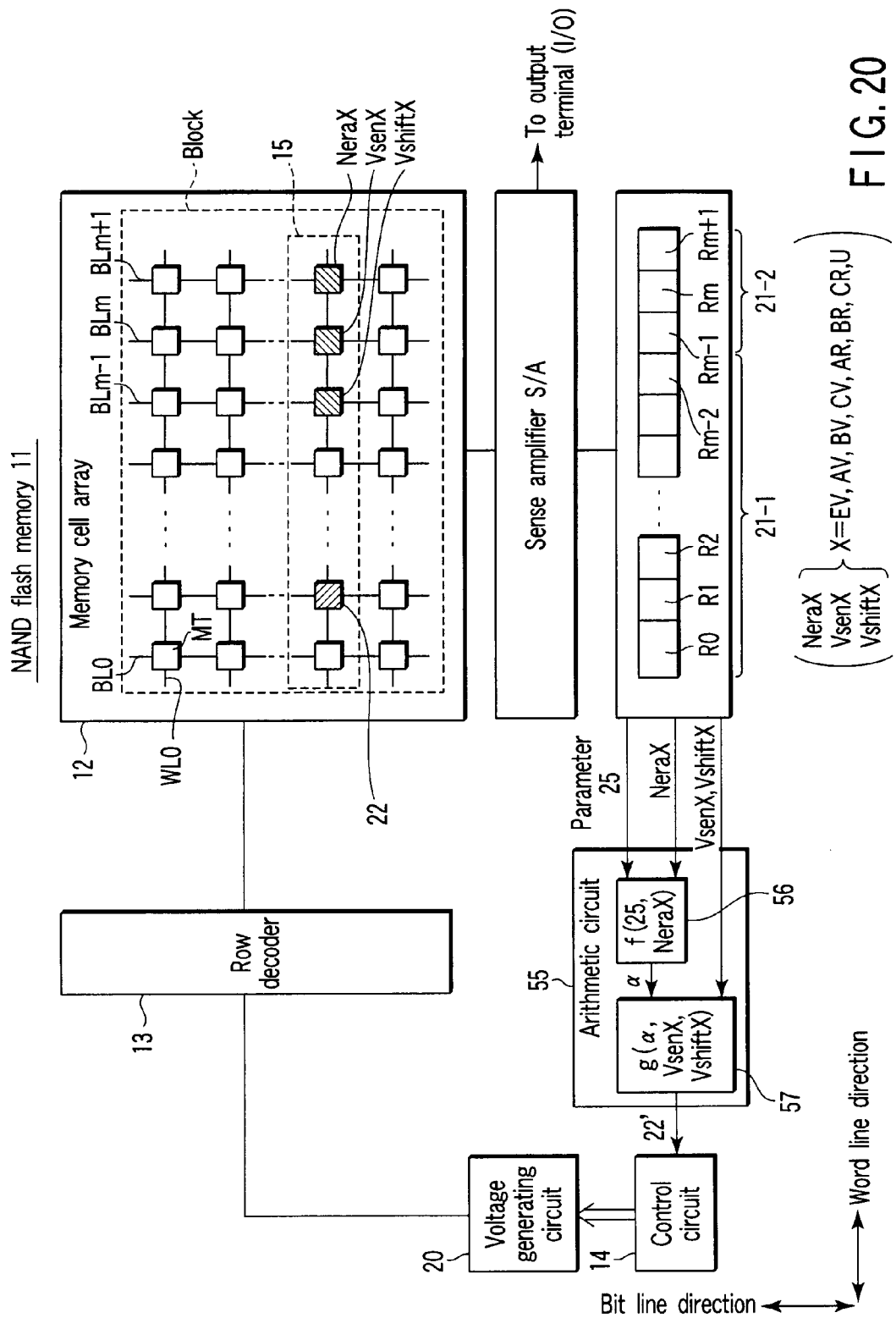
FIG. 20 is a block diagram showing a semiconductor memory device according to a third embodiment of the present invention.

To begin with, referring to FIG. 20, a description is given of an example of the structure of the semiconductor memory device according to the present embodiment.

As shown in FIG. 20, the semiconductor memory device of this embodiment differs from that of the first embodiment in the following respects.

The memory circuit 15 stores a reference pulse number NeraX, a voltage VsenX at a sense time (sense-time voltage VsenX), and a bottom shift amount VshiftX of a threshold voltage (threshold voltage bottom shift amount VshiftX). EV, AV, BV, CV, AR, BR, CR and U are substituted for the "X" in these symbols. Actually, the memory circuit 15 stores reference pulse numbers NeraEV to NeraCR, sense-time voltages VsenEV to VsenCR, and threshold voltage bottom shift amounts VshiftEV to VshiftCR. A memory circuit 14 for a non-selected word line WL stores a reference pulse number NeraU, a sense-time voltage VsenU and a threshold voltage bottom shift amount VshiftU.

In this embodiment, an arithmetic circuit 55 which determines a parameter is provided.

The arithmetic circuit 55 comprises a deterioration information (α) detection circuit 56 and a shift amount determination circuit 57.

The deterioration information (α) detection circuit 56 is configured to execute a function f (parameter 25, NeraX) for detecting deterioration information (α) on the basis of the parameter 25 and reference pulse number NeraX.

The shift amount determination circuit 57 is configured to execute a function g (α, VsenX, VshiftX) for determining a shift amount on the basis of the deterioration information α, sense-time voltage VsenX and threshold voltage bottom shift amount VshiftX.

<Re: Reference Pulse Number, Etc. Stored in the Memory Circuit and Threshold Voltage Distributions (4 Values)>

Next, referring to FIG. 21 and FIG. 22, a detailed description is given of the reference pulse number NeraX, sense-time voltage VsenX, threshold voltage bottom shift amount VshiftX and parameter 25, which are stored in the memory circuit 15, and threshold voltage distributions (4 values).

The reference pulse number NeraX, sense-time voltage VsenX, threshold voltage bottom shift amount VshiftX and parameter 25, which are stored in the memory circuit 15, are as shown in FIG. 21.

In addition, the threshold voltage distributions of the multilevel NAND flash memory according to the present embodiment are as shown in FIG. 22. As shown in FIG. 22, the threshold voltage distributions are discriminated by four threshold voltages, i.e. "11(E)" that is "erase state", and "01(A)", "10(B)" and "00(C)" that are "write states".

Thus, the reference pulse numbers NeraX in FIG. 21 are defined as follows:

NeraEV: a reference pulse number which determines whether an upper bottom (erase verify level) of the "11(E)" level is to be shifted or not;

NeraAV: a reference pulse number which determines whether a lower bottom (program verify level) of the "01(A)" level is to be shifted or not;

NeraBV: a reference pulse number which determines whether a lower bottom (program verify level) of the "10(B)" level is to be shifted or not;

NeraCV: a reference pulse number which determines whether a lower bottom (program verify level) of the "00(C)" level is to be shifted or not;

NeraAR: a reference pulse number which determines whether a "11(E)"/"01(A)" discrimination level (read level) is to be shifted or not;

NeraBR: a reference pulse number which determines whether a "01(A)"/"10(B)" discrimination level (read level) is to be shifted or not;

NeraCR: a reference pulse number which determines whether a "10(B)"/"00(C)" discrimination level (read level) is to be shifted or not; and NeraU: a reference pulse number for a non-selected word line (WL).

The sense-time voltages VsenX are input to the shift amount determination circuit 57 at the time of the erase, read and write operations (to be described later), and are defined as follows:

VsenEV: an erase verify level voltage;
VsenAV: a program verify level voltage of "01"(A) level;
VsenBV: a program verify level voltage of "10"(B) level;
VsenCV: a program verify level voltage of "00"(C) level;
VsenAR: a "11(E)"/"01(A)" discrimination level voltage;
VsenBR: a "01(A)"/"10(B)" discrimination level voltage;
VsenCR: a "10(B)"/"00(C)" discrimination level voltage; and
VsenU: a sense-time voltage for a non-selected word line (WL).

Similarly, the threshold voltage distribution bottom shift amounts VshiftX are input to the shift amount determination circuit 57 at the time of the erase, read and write operations (to be described later), and are defined as follows:

VshiftEV: a shift amount of an erase verify level voltage;
VshiftAV: a shift amount of a program verify level voltage of "01" (A) level;
VshiftBV: a shift amount of a program verify level voltage of "10"(B) level;
VshiftCV: a shift amount of a program verify level voltage of "00"(C) level;
VshiftAR: a shift amount of a "11(E)"/"01(A)" discrimination level voltage;
VshiftBR: a shift amount of a "01(A)"/"10(B)" discrimination level voltage;
VshiftCR: a shift amount of a "10(B)"/"00(c)" discrimination level voltage; and
VshiftU: a shift amount for a non-selected word line (WL).

The reference pulse number NeraX, sense-time voltage VsenX and threshold voltage bottom shift amount VshiftX are stored in the memory circuit 15 from the initial state.

On the other hand, the parameter 25 is representative of the pulse number, i.e. the number of times of pulse application at the erase time, and is stored in the memory circuit 15 at the time of the erase operation.

<Erase Operation>

Figure 23:
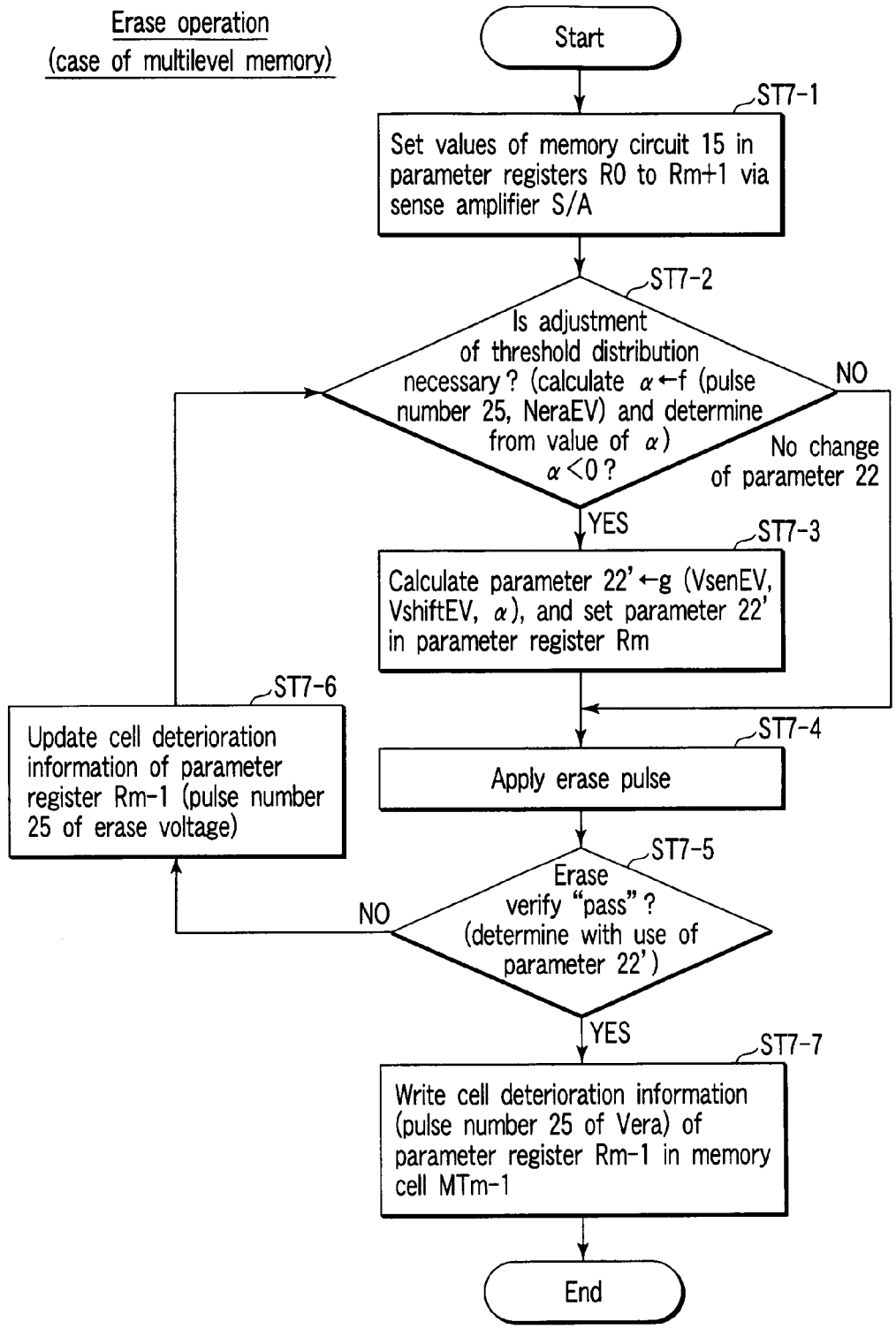
FIG. 23 is a flow chart illustrating an erase operation of the semiconductor memory device according to the third embodiment.
Figure 24:
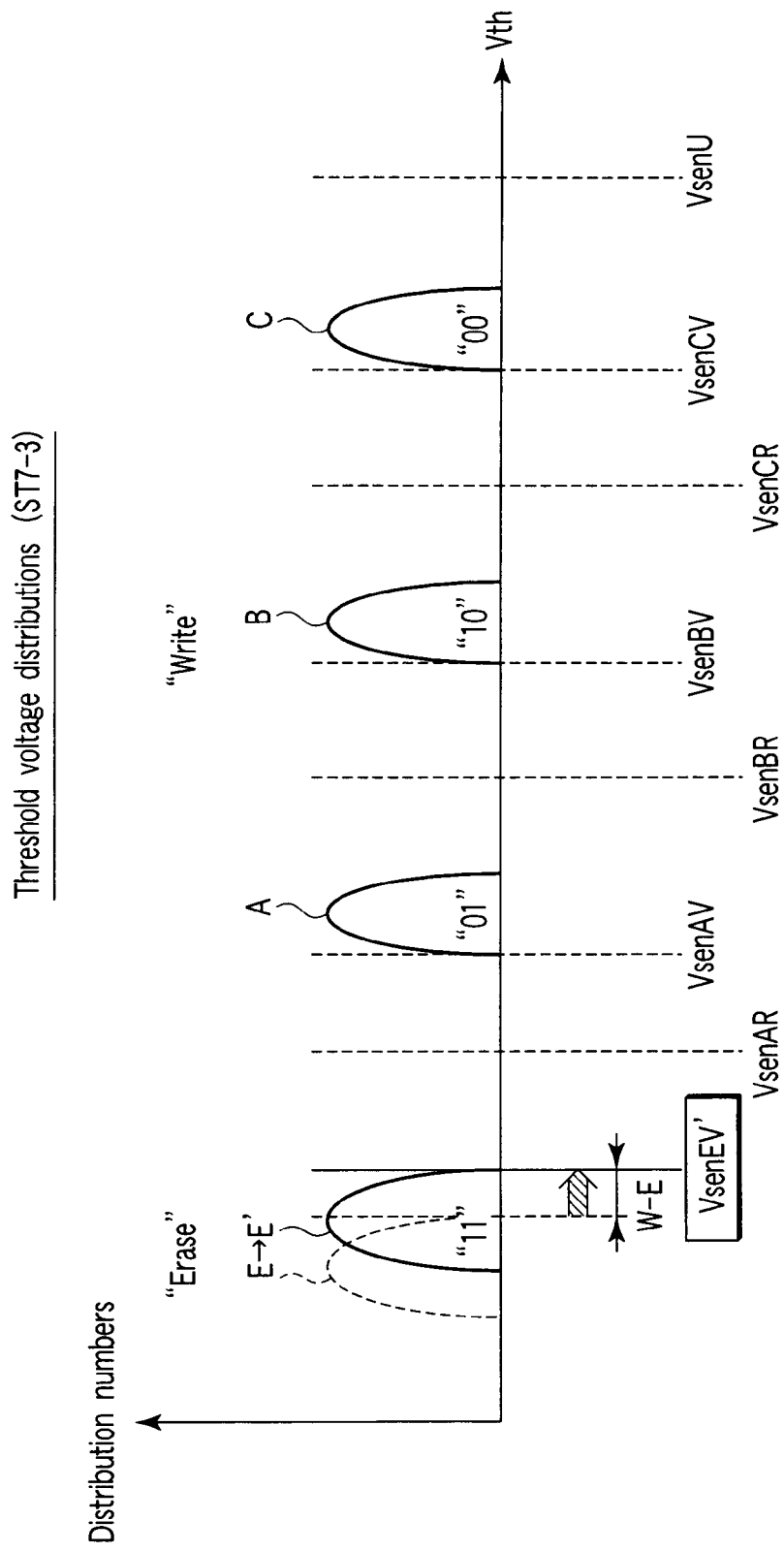
FIG. 24 shows threshold voltage distributions of an erase operation (step ST7-3) in the semiconductor memory device according to the third embodiment.

Next, referring to FIG. 23 and FIG. 24, a description is given of an erase operation, which is an embodiment of a control method of the semiconductor memory device according to the present embodiment. The description of the erase operation is based on the flow chart of FIG. 23.

(Step ST7-1)

To start with, the control circuit 14 reads out the data, which are stored in the memory circuit (page 2 (PAGE2)) 15, by means of the sense amplifier S/A, and sets the read-out data in the associated parameter registers R0 to Rm+1.

At this time, the pulse number 25 of the erase voltage, which is counted and stored in a subsequent step ST7-2, is set at 0 and stored in the parameter register.

(Step ST7-2 (Detection of Cell Degradation Information (α)))

Subsequently, it is checked whether adjustment of the threshold voltage distribution is necessary, and thereby the deterioration information α of the memory cell MT is detected. Specifically, the deterioration information (α) detection circuit 56 executes a function f (parameter 25, NeraX) for detecting deterioration information (α), on the basis of the parameter 25 and reference pulse number NeraX. In the present embodiment, the function f (parameter 25, NeraX) carries out an arithmetic operation indicated by the following equation (※)

$$\text{Function } f(\text{parameter 25, NeraEV}) = \text{NeraEV} - 25 = \alpha \quad \text{equation (※)}$$

In short, the deterioration information detection circuit 56 executes an arithmetic operation to determine whether the deterioration information α is less than 0 (α<0?).

To be more specific, the deterioration information detection circuit 56 calculates a difference between the counted pulse number (parameter) 25 of the erase voltage Vera, which is set in the parameter register, and the reference pulse number NeraEV of the erase voltage Vera.

For example, if the reference pulse number NeraEV of Vera is 3, a difference between the actually counted pulse number 25 of Vera and the reference pulse number of 3 is calculated. Based on the result of the arithmetic operation, it can be detected that the degree of deterioration of the memory cell is higher as the deterioration information α has a greater negative value.

If the result of the arithmetic operation shows that the deterioration information α is not a negative value, the parameter 22 is not changed and the process goes to step ST7-4 of applying an erasure pulse.

(Step ST7-3 (Arithmetic Operation of Shift Amount))

If the result of the above arithmetic operation shows that the deterioration information α has a negative value and the adjustment of the threshold voltage distribution is necessary, it can be determined that the number of times of rewrite of the memory cell MT has increased and the memory cell MT has deteriorated. As a result, it can be detected that the threshold voltage distribution has shifted to the higher voltage value side and the bottom of the distribution has spread. Thus, in step ST7-3, the shift amount determination circuit 57 executes an arithmetic operation to determine how much the sense-time voltage VsenEV is to be shifted in the threshold voltage distribution "11(E)".

Specifically, the shift amount determination circuit 57 executes a function g (α, VsenEV, VshiftEV) for calculating the shift amount, on the basis of the deterioration information α, sense voltage VsenEV and shift amount VshiftEV. In the case of the present embodiment, the function g (α, VsenEV, VshiftEV) executes an arithmetic operation indicated by the following equation (※※):

$$\text{Function } g(\alpha, \text{VsenEV, VshiftEV}) = \text{VsenEV} + \text{VshiftEV} \times |\alpha| 32\ 22' \quad \text{equation (※※)}$$

In short, in the case of the present embodiment, the shift amount determination circuit 57 determines the shift amount that is proportional to the deterioration information α.

The control circuit 14 sets in the parameter register Rm the parameter 22' which is obtained by changing the parameter 22 in a manner to increase the value of the sense-time voltage VsenEV (i.e. in a manner to shift the voltage value to a higher value side).

(Step ST7-4 (Application of an Erase Pulse))

Subsequently, if it is determined in step ST7-2 that the adjustment of the threshold voltage distribution is not necessary, the control circuit 14 applies an erasure pulse by using the parameter 22.

On the other hand, if it is determined that the adjustment of the threshold voltage distribution is necessary, the control circuit 14 applies an erasure pulse by using the changed parameter 22'.

(Step ST7-5 (Erase Verify "Pass"?)

Subsequently, the control circuit 14 checks whether the pass of the erase verify level is enabled. Specifically, the control circuit 14 applies a voltage of the erase verify level to the word line WL, and checks whether a predetermined memory cell MT has been erased.

At this time, in the case where the parameter 22 has been changed, the check is made on the basis of the changed erase verify level VsenEV' by using the changed parameter 22'.

A shift amount W-E of the threshold voltage distribution "11(E)" in this case can be varied on the basis of the deterioration information α, or VsenEV or VshiftEV that is substituted in the function g, or by the definition equation (※) itself of the function f or the definition equation (※※) of the function g. Therefore, the optimal shift amount can be selected in accordance with the deterioration state of the erasure of the threshold voltage distribution "11(E)".

(Step ST7-6)

Then, if the result of the above check shows that the pass of the erase verify level 33 is not enabled, the control circuit 14 sets the actually counted, updated pulse number 25' of the erase voltage in the parameter register Rm−1, for instance. Then, the control circuit 14 executes step ST7-2 once again.

(Step ST7-7)

Subsequently, if the result of the above check shows that the pass of the erase verify level is enabled, the control circuit 14 writes the pulse number 25 of the erase voltage Vera, which is set in the parameter register Rm−1, in the memory cell MTm−1.

Subsequently, the same steps ST7-1 to ST7-7 are repeated, and the erase operation of the semiconductor memory device according to the present embodiment is executed.

<Read Operation>

Figure 25:
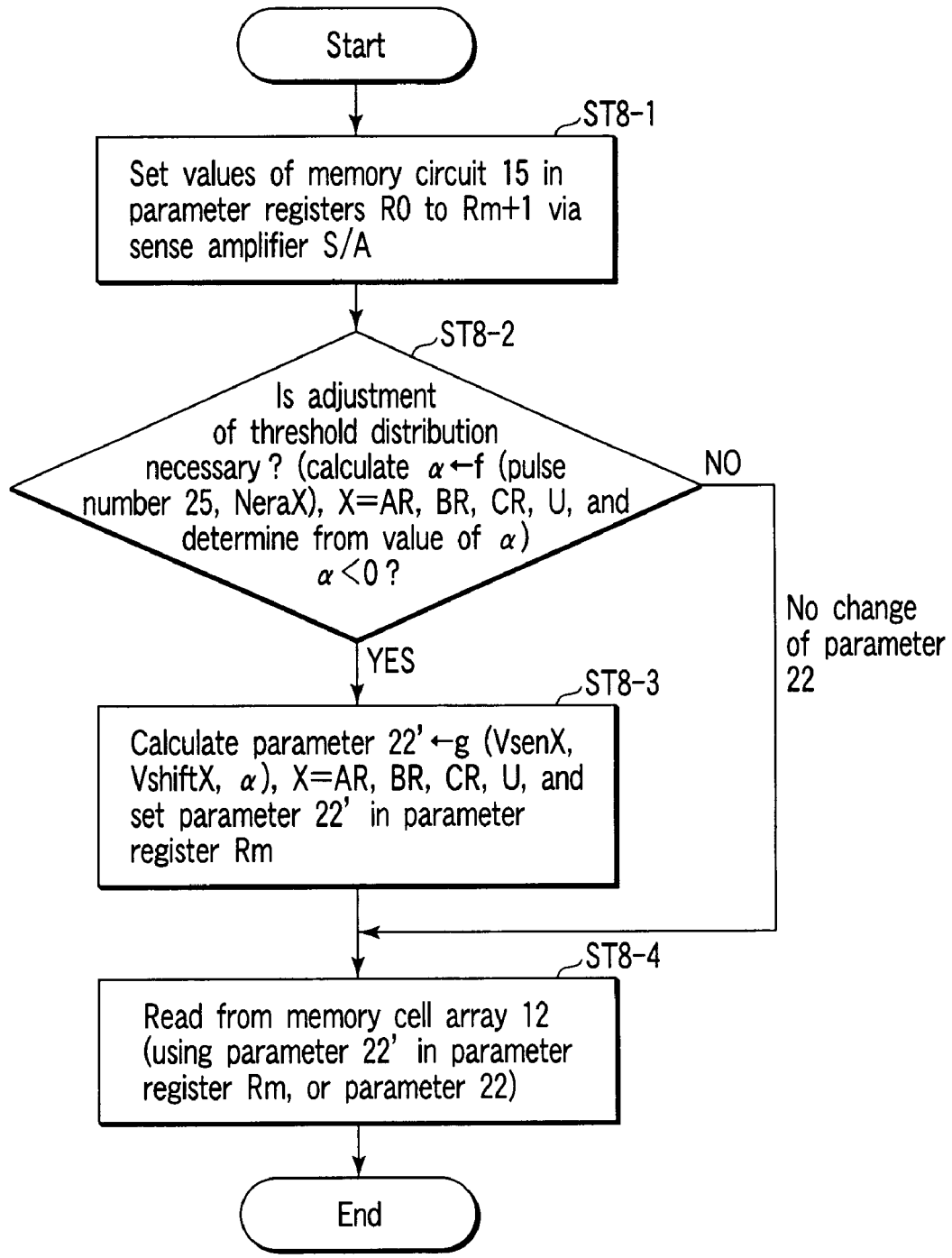
FIG. 25 is a flow chart illustrating a read operation of the semiconductor memory device according to the third embodiment.
Figure 26:
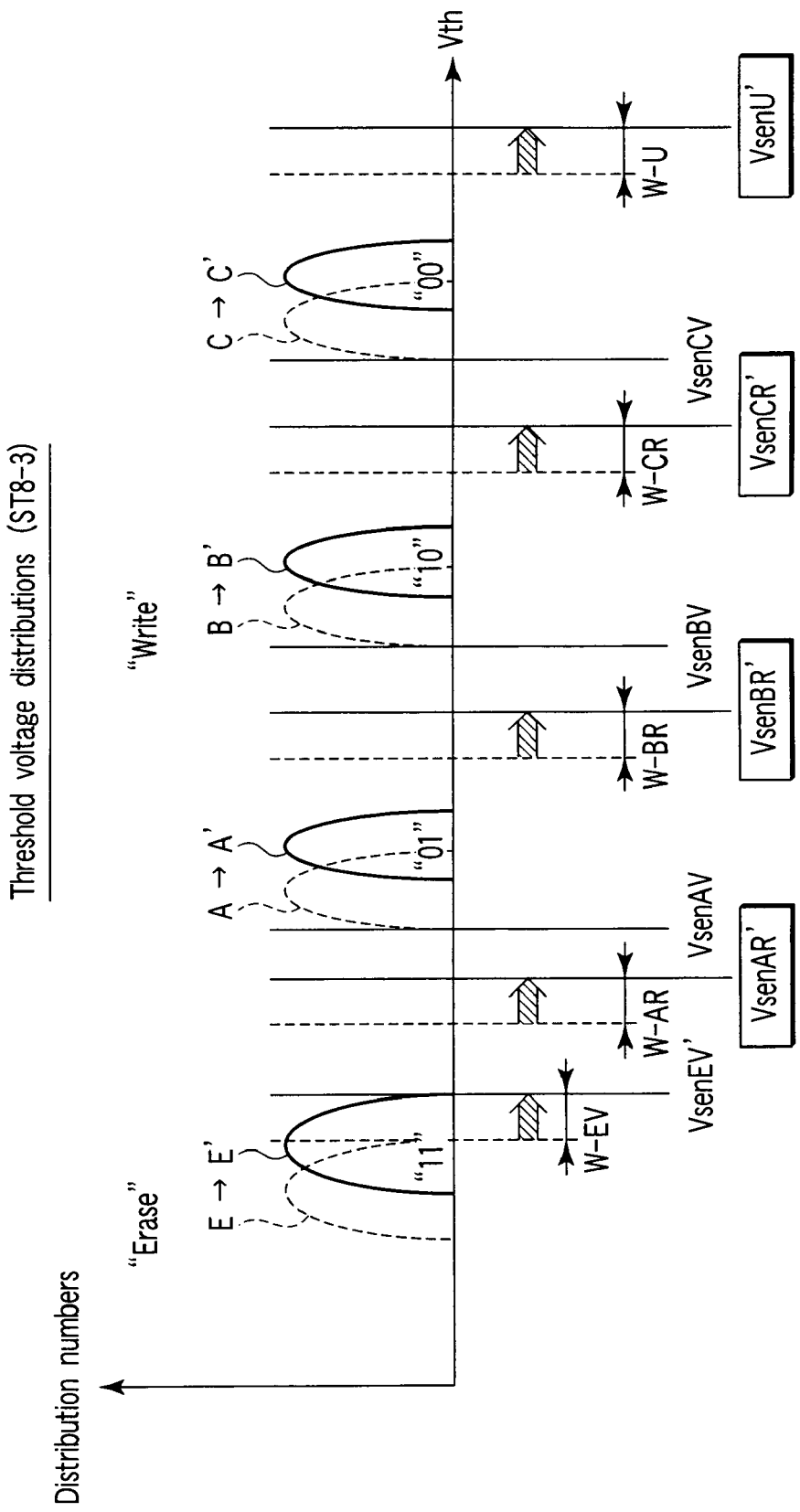
FIG. 26 shows threshold voltage distributions of a read operation (step ST8-3) in the semiconductor memory device according to the third embodiment.

Next, referring to FIG. 25 and FIG. 26, a description is given of a read operation, which is an embodiment of the control method of the semiconductor memory device according to the present embodiment. The description of the read operation is based on the flow chart of FIG. 25.

(Step ST8-1)

To start with, the control circuit 14 reads out values of the page 2 (PAGE2), which is the memory circuit 15, by means of the sense amplifier S/A, and sets the read-out values in the associated parameter registers R0 to Rm+1.

(Step ST8-2 (Detection of Degradation Information α))

Subsequently, it is checked whether adjustment of the threshold voltage distribution is necessary, by using the set values (parameter 25, pulse number NeraX; X=AR, BR, CR, U). Thereby, the degradation information α of the memory cell MT is detected.

Specifically, the deterioration information detection circuit 56 executes the function f (parameter 25, NeraX; X=AR, BR, CR, U) for detecting deterioration information α, on the basis of the parameter 25 and reference pulse number NeraX. In the present embodiment, the function f (parameter 25, NeraX) carries out the arithmetic operation indicated by the above-described equation (✳). In short, the deterioration information detection circuit 56 executes the arithmetic operation to determine whether the deterioration information α is less than 0 (α<0?).

If the result of the arithmetic operation of the function f shows that the deterioration information α is not a negative value, the parameter 22 is not changed and the process goes to step ST8-4 of executing data read from the memory cell array 12.

(Step ST8-3 (Arithmetic Operation of Shift Amount))

If the result of the above arithmetic operation shows that the deterioration information α has a negative value and the adjustment of the threshold voltage distribution is necessary, it can be determined that the number of times of rewrite of the memory cell MT has increased and the memory cell MT has deteriorated. Accordingly, it can be detected that the three threshold voltage distributions "01(A)", "10(B)" and "00(C)" have shifted to the higher voltage value side (A→A', B→B', C→C') and the bottom of each distribution has spread. Thus, the shift amount determination circuit 57 executes an arithmetic operation to determine how much the sense-time discrimination level voltages VsenAR, VsenBR, VsenCR and VsenU are to be shifted with respect to the three threshold voltage distributions "01(A)", "10(B)" and "00(C)".

Specifically, the shift amount determination circuit 57 executes the function g (α, VsenEV, VshiftX; X=AR, BR, CR, U) for calculating the shift amount, on the basis of the deterioration information α, sense voltage VsenX and shift amount VshiftX (X=AR, BR, CR, U). In the case of the present embodiment, the function g (α, VsenX, VshiftX; X=AR, BR, CR, U) executes the arithmetic operation indicated by the above equation (✳✳).

In short, the shift amount determination circuit 57 determines the shift amount of the discrimination level voltage, which is proportional to the deterioration information α.

The control circuit 14 sets the parameter 22', which is a changed parameter of the parameter 22, in the parameter register, thereby to increase the value of the sense-time discrimination level voltages VsenAR, VsenBR, VsenCR and VsenU (i.e. to shift the voltage value to a higher value side).

(Step ST8-4)

If the result of the above check shows that the change of the read level is not necessary, the control circuit 14 controls the voltage generating circuit 20 so as to execute data read of a predetermined page in the memory cell array 12 with the pre-change read parameter 22.

On the other hand, if the change of the read level is necessary, the control circuit 14 controls the voltage generating circuit 20 so as to execute data read of a predetermined page in the memory cell array 12 by using the changed read parameter 22' on the basis of the changed sense-time discrimination level voltages VsenAR', VsenBR', VsenCR' and VsenU'.

The shift amounts W-AR, W-BR, W-CR and W-U can be varied on the basis of the deterioration information α, or VsenX or VshiftX that is substituted in the function g, or by the definition equation (✳) itself of the function f or the definition equation (✳✳) of the function g. Therefore, the optimal shift amounts of the sense-time discrimination level voltages VsenAR, VsenBR, VsenCR and VsenU can be selected in accordance with the deterioration state of the read of the three threshold voltage distributions "01(A)", "10(B)" and "00(C)".

Subsequently, the same steps ST8-1 to ST8-4 are repeated, and the read operation of the semiconductor memory device according to the present embodiment is executed. By the read operation of this embodiment, the data in a predetermined page can be read, either before or after the change of the read level.

<Write Operation>

Figure 27:
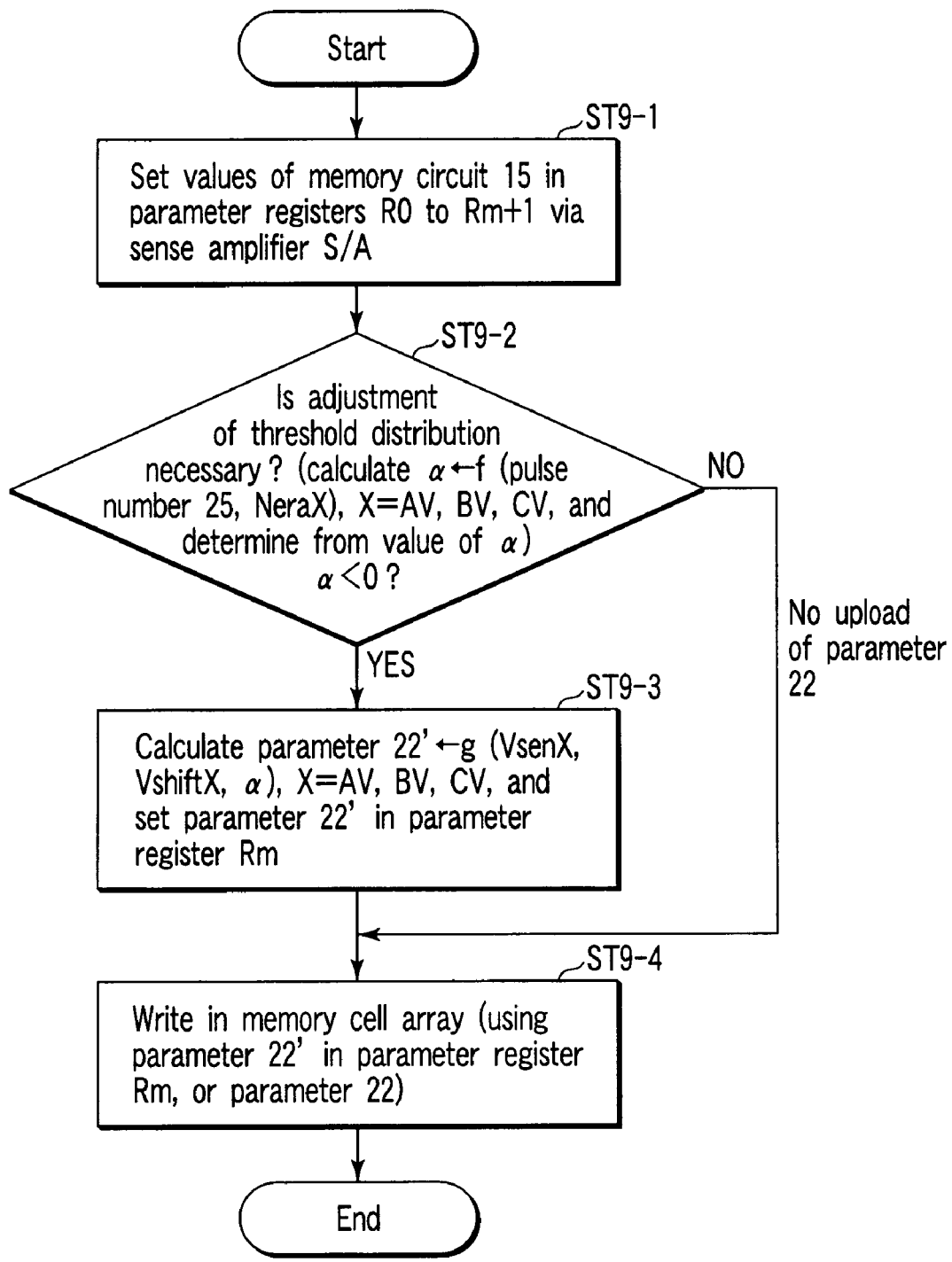
FIG. 27 is a flow chart illustrating a write operation of the semiconductor memory device according to the third embodiment.
Figure 28:
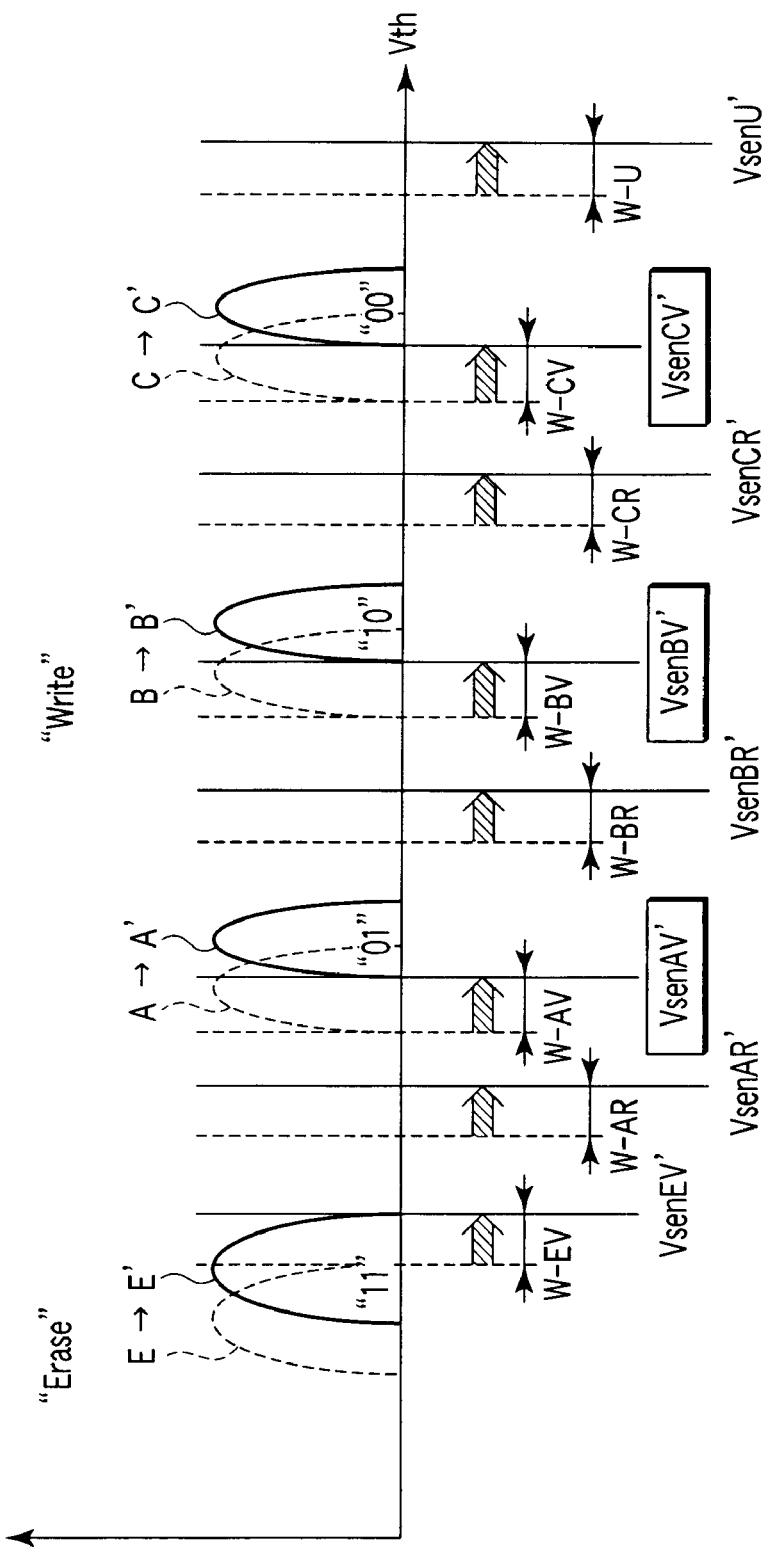
FIG. 28 shows threshold voltage distributions of a write operation (step ST9-3) in the semiconductor memory device according to the third embodiment.

Next, referring to FIG. 27 and FIG. 28, a description is given of a write operation, which is an embodiment of the control method of the semiconductor memory device according to the present embodiment. The description of the read operation is based on the flow chart of FIG. 27.

(Step ST9-1)

To start with, the control circuit 14 reads out values of the page 2 (PAGE2), which is the memory circuit 15, by means of the sense amplifier S/A, and sets the read-out values in the associated parameter registers R0 to Rm+1.

(Step ST9-2 (Detection of Degradation Information α))

Subsequently, it is checked whether adjustment of the threshold voltage distribution is necessary, by using the set values (parameter 25, pulse number NeraX; X=AV, BV, CV). Thereby, the degradation information α of the memory cell MT is detected.

Specifically, the deterioration information detection circuit 56 executes the function f (parameter 25, NeraX; AV, BV, CV) for detecting deterioration information α, on the basis of the parameter 25 and reference pulse number NeraX. In the present embodiment, the function f (parameter 25, NeraX) carries out the arithmetic operation indicated by the above-described equation (✳). In short, the deterioration information detection circuit 56 executes the arithmetic operation to determine whether the deterioration information α is less than 0 (α<0?).

If the result of the arithmetic operation of the function f shows that the deterioration information α is not a negative value, the parameter 22 is not changed and the process goes to step ST9-4 of executing data write in the memory cell array 12.

(Step ST9-3 (Arithmetic Operation of Shift Amount))

If the result of the above arithmetic operation shows that the deterioration information α has a negative value and the adjustment of the threshold distribution is necessary, it can be determined voltage that the number of times of rewrite of the memory cell MT has increased and the memory cell MT has deteriorated. Accordingly, as shown in FIG. 28, it can be detected that the three threshold voltage distributions "01(A)", "10(B)" and "00(C)" have shifted to the higher voltage value side (A→A', B→B', C→C') and the bottom of each distribution has spread. Thus, the shift amount determination circuit 57 executes an arithmetic operation to determine how much the program verify level voltages VsenAV, VsenBV and VsenCV are to be shifted with respect to the three threshold voltage distributions "01(A)", "10(B)" and "00(C)".

Specifically, the shift amount determination circuit 57 executes the function g (α, VsenX, VshiftX; X=AV, BV, CV) for calculating the shift amount, on the basis of the deterioration information α, sense program verify level voltage VsenX and shift amount VshiftX (X=AV, BV, CV). In the case of the present embodiment, the function g (α, VsenX, VshiftX; X=AV, BV, CV) executes the arithmetic operation indicated by the above equation (✳✳).

In short, the shift amount determination circuit 57 determines the shift amount of the program verify level voltage, which is proportional to the deterioration information α.

The control circuit 14 sets the parameter 22', which is a changed parameter of the parameter 22, in the parameter register so as to increase the value of the sense-time program verify level voltages VsenAV, VsenBV and VsenCV (i.e. so as to shift the voltage value to a higher value side).

(Step ST9-4)

If the result of the above check shows that the change of the program verify level voltage is not necessary, the control circuit 14 controls the voltage generating circuit 20 so as to execute data write of a predetermined page in the memory cell array 12 with the pre-change read parameter 22.

On the other hand, if the change of the program verify level voltage is necessary, the control circuit 14 controls the voltage generating circuit 20 so as to execute data write of a predetermined page in the memory cell array 12 by using the changed parameter 22', with the changed sense-time discrimination level voltages VsenAV', VsenBV' and VsenCV'.

The shift amounts W-AV, W-BV and W-CV can be varied on the basis of the deterioration information α, or VsenX or VshiftX (X=AV, BV, CV) that is substituted in the function g, or by the definition equation (※) itself of the function f or the definition equation (※※) of the function g. Therefore, the optimal shift amounts of the sense-time voltages VsenAV, VsenBV and VsenCV can be selected in accordance with the deterioration state of the write of the three threshold voltage distributions "01(A)", "10(B)" and "00 (C)".

Subsequently, the same steps ST9-1 to ST9-4 are repeated, and the write operation of the semiconductor memory device according to the present embodiment is executed. By the write operation of this embodiment, the data write in a predetermined page can be executed, either before or after the change of the program verify level voltage.

Advantageous Effects of the Present Embodiment

According to the semiconductor memory device and the control method of the present embodiment, the same advantageous effects as the above-described (1) to (4) can be obtained. Furthermore, the following advantageous effect (6) and (7), at least, can be obtained.

(6) Even in the case where the memory cell MT of the multilevel NAND flash memory has deteriorated, the optimal shift amount can be selected in accordance with the deterioration state of each threshold voltage distribution, and the number of defective elements can be reduced.

In the present embodiment, the reference pulse number NeraX, sense-time voltage VsenX and threshold-value bottom shift amount VshiftX are stored in the memory circuit 15, and the memory device includes the arithmetic circuit 55 which determines the parameter and comprises the deterioration information detection circuit 56 and shift amount determination circuit 57.

Thus, for example, as shown in FIG. 24, in the erase operation, the shift amount determination circuit 57 can calculate the erase verify level voltage VsenEV' on the basis of the deterioration information α that is calculated by the deterioration information detection circuit 56.

At this time, the shift amount W-E of the erase verify level voltage of the threshold voltage distribution "11(E)" can be varied on the basis of the deterioration information α, or VsenEV or VshiftEV that is substituted in the function g, or by the definition equation (※) itself of the function f or the definition equation (※※) of the function g. Therefore, the optimal shift amount can be selected in accordance with the deterioration state of the threshold voltage distribution "11 (E)".

Similarly, as shown in FIG. 26, the read operation can be executed with the optimal shift amounts W-AR, W-BR, W-CR and W-U of the discrimination level voltages with respect to the discrimination level voltages VsenAR', VsenBR' and VsenCR'.

Similarly, as shown in FIG. 28, the write operation can be executed with the optimal shift amounts W-AV, W-BV and W-CV of the program verify level voltages with respect to the program verify level voltages VsenAV', VsenBV' and VsenCV'.

As has been described above, even in the case where the memory cell MT of the multilevel NAND flash memory has deteriorated, the optimal shift amount can be selected in accordance with the deterioration state of each threshold voltage distribution, and the number of defective elements can be reduced.

(7) Even in the case where write disturb (program disturb) or read disturb has occurred, the optimal shift amount can be selected in accordance with the deterioration state of each threshold value distribution, and the number of defective elements can be reduced.

Figure 29:
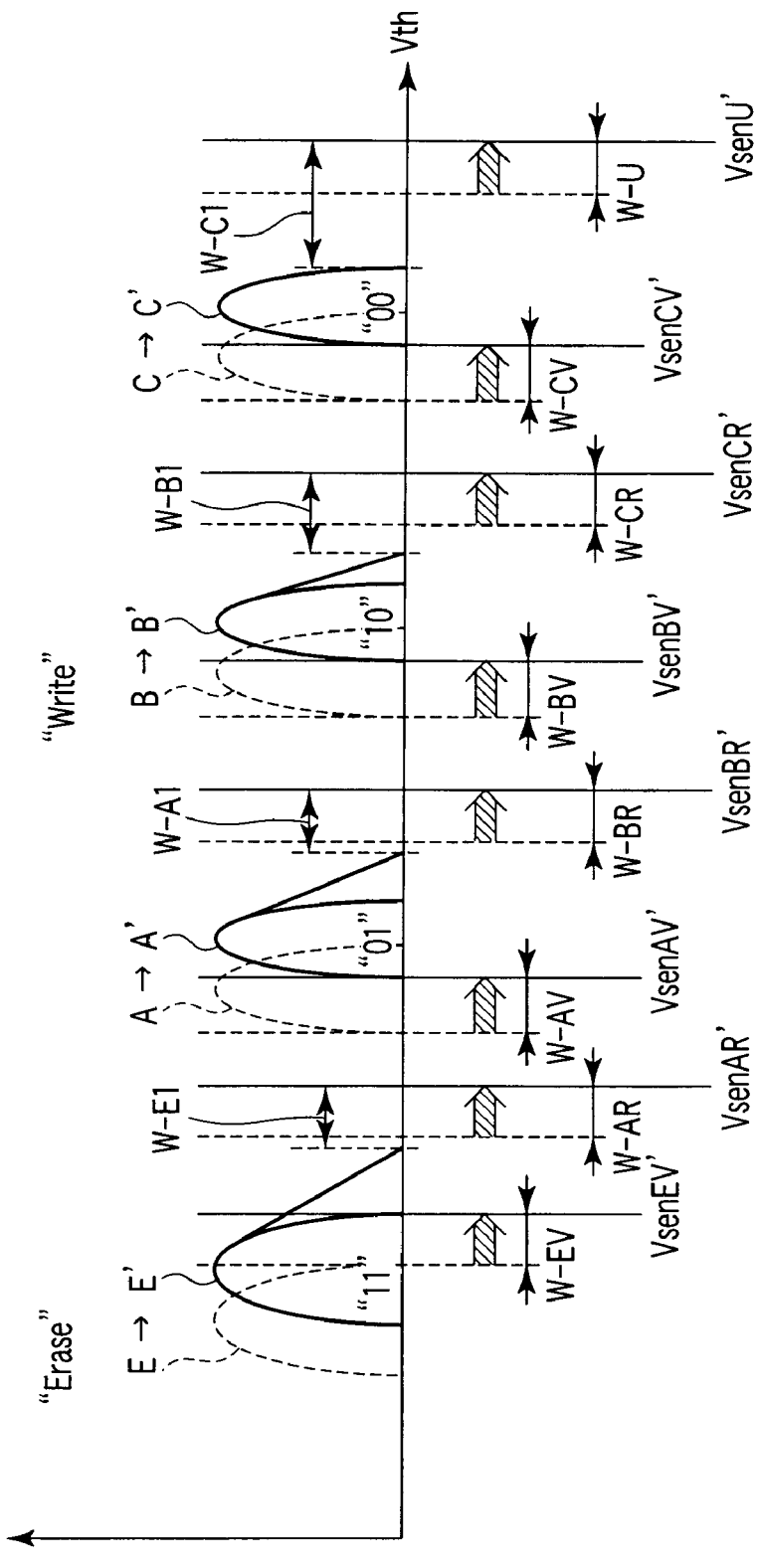
FIG. 29 shows threshold voltage distributions in a case where a program disturb has occurred in the semiconductor memory device according to the third embodiment.

For example, as shown in FIG. 29, when program disturb has occurred, upper bottoms of four threshold voltage distributions "11(E)", "01(A)", "10(B)" and "00(C)" shift to the higher voltage value side. However, the width of shift of the upper bottom varies from threshold voltage distribution to threshold voltage distribution. As shown in FIG. 29, the amounts of shift decrease in the order of "11(E)", "01(A)", "10(B)" and "00(C)", and accordingly the width W-E1, width W-A1, width W-B1 and width W-C1 increase in the named order.

However, in the present embodiment, as described above, the discrimination level voltages VsenAR', VsenBR', VsenCR' and VsenU', for instance, can be selected in accordance with the deterioration state of the threshold voltage distribution. As a result, even if program disturb has occurred, the optimal shift amount can be selected in accordance with the deterioration state of each threshold voltage distribution, and the number of defective elements can be reduced.

Figure 30:
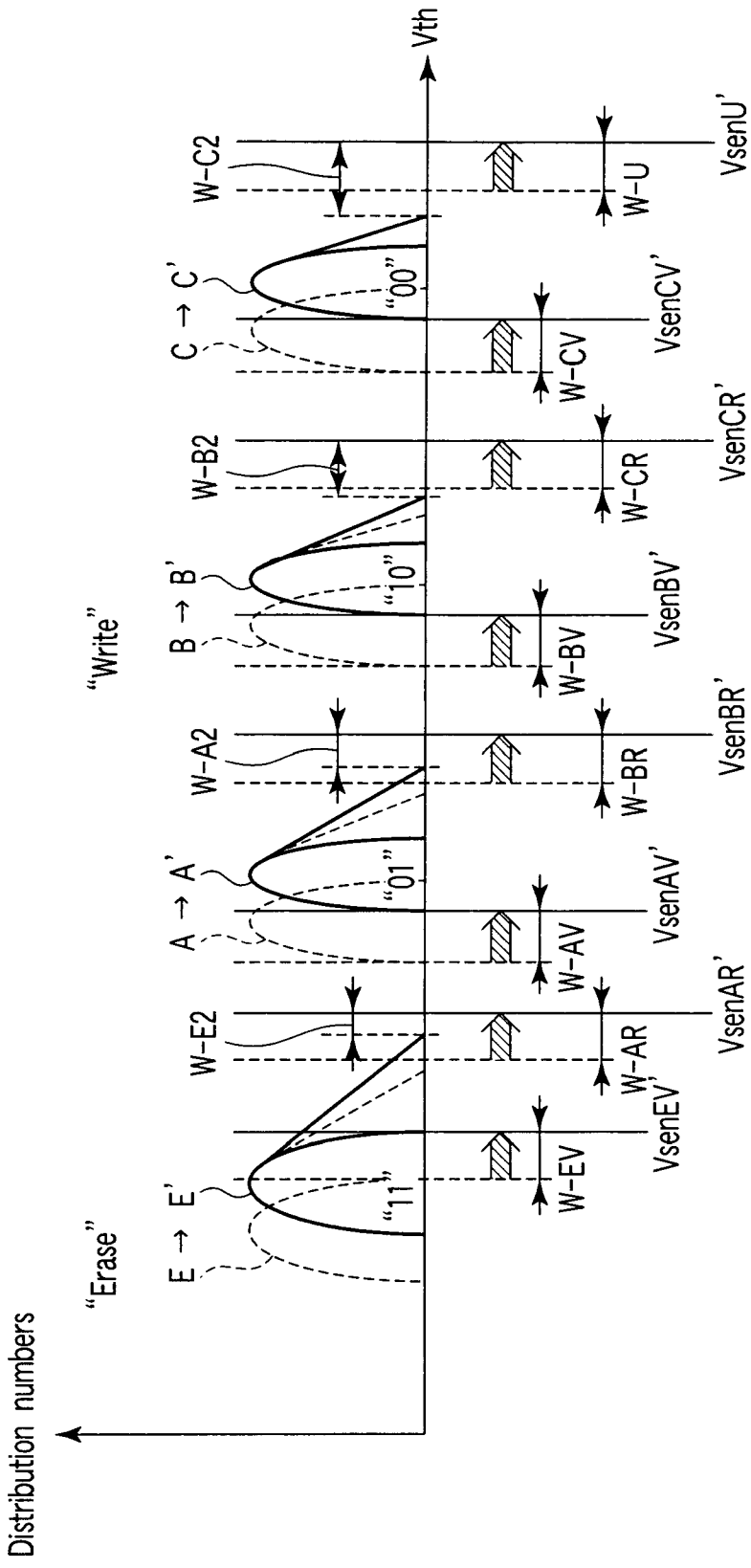
FIG. 30 shows threshold voltage distributions in a case where a read disturb has occurred in the semiconductor memory device according to the third embodiment.

In addition, as shown in FIG. 30, when read disturb has occurred, upper bottoms of four threshold voltage distributions "11(E)", "01(A)", "10(B)" and "00(C)" shift to the higher voltage value side. Similarly, the width of shift of the upper bottom varies from threshold voltage distribution to threshold voltage distribution. As shown in FIG. 30, the amounts of shift decrease in the order of "11(E)", "01(A)", "10(B)" and "00(C)", and accordingly the width W-E2, width W-A2, width W-B2 and width W-C2 increase in the named order.

However, in the present embodiment, as described above, the discrimination level voltages VsenAR', VsenBR', VsenCR' and VsenU', for instance, can be selected in accordance with the deterioration state of the threshold voltage distribution. As a result, even if read disturb has occurred, the optimal shift amount can be selected in accordance with the deterioration state of each threshold voltage distribution, and the number of defective elements can be reduced.

Aside from the discrimination level voltages, other voltage levels, such as erase verify level voltage VsenEV, can be varied in accordance with the deterioration state of all threshold voltage distributions, by selecting the deterioration information α, or VsenEV or VshiftEV that is substituted in the function g, or by the definition equation (※) itself of the function f or the definition equation (※※) of the function g.

As described above, in the multilevel NAND flash memory, the interval of threshold voltage voltages of neighboring threshold voltage distributions is less than in the case of the single-level NAND flash memory. Thus, in the case where the present embodiment is applied to the multilevel NAND flash memory, a great merit is obtained since the optimal shift amount can be selected in accordance with the deterioration state of the threshold voltage distribution.

In the present embodiment, the 4-value multilevel NAND flash memory has been described as an example of the multilevel NAND flash memory. However, the invention is not limited to the 4-value multilevel NAND flash memory, and is similarly applicable to other multilevel NAND flash memories such as an 8-value multilevel NAND flash memory, a 16-value multilevel NAND flash memory and a 32-value multilevel NAND flash memory, and the same advantageous effects can be obtained. Moreover, as the degree of the multilevel architecture becomes higher, like 8-value, 16-value and 32-value, the interval of threshold voltage voltages of neighboring threshold voltage distributions becomes smaller. Accordingly, it is considered that a greater merit is obtained by the application of the present embodiment.

FOURTH EMBODIMENT

Example Including a Cache Memory

Next, a semiconductor memory device according to a fourth embodiment of the invention is described with reference to FIG. 31 to FIG. 33. The fourth embodiment relates to an example of a multilevel NAND flash memory which includes a cache memory. In the description below, a description of the parts common to those in the third embodiment is omitted.

As shown in FIG. 15, the semiconductor memory device of this embodiment differs from that of the third embodiment in that the semiconductor memory device further includes cache memories C0 to Cm+1 which have inputs connected to the sense amplifier S/A and have outputs connected to the parameter registers R0 to Rm+1. For example, an SRAM (Static Random-Access Memory) is applied to each of the cache memories C0 to Cm+1.

The parameter 22, etc. in the memory circuit 15 are read out batchwise in advance via the sense amplifier S/A into the cache memories C0 to Cm+1, for example, when power is turned on (power-on operation time). For example, at the power-on operation time, the parameter 22, the reference pulse number NeraX of erase voltage, VsenX, and VshiftX (X=EV, AV, BV, CV, AR, BR, CR, U) are read out to the cache memories C0 and Cm+1.

<Erase Operation>

Next, referring to FIG. 31, a description is given of an erase operation, which is an embodiment of a control method of the semiconductor memory device according to the present embodiment.

(Step ST10-1)

To start with, unlike the third embodiment, the control circuit 14 sets the data, which have been read out to the cache memories C0 to Cm+1, in the associated parameter registers R0 to Rm+1. For example, the parameter 22 that is stored in the cache memory and the reference pulse number NeraX, VsenX, VshiftX (X=EV, AV, BV, CV, AR, BR, CR, U) that are stored in the cache memories are set in the associated parameter registers.

The reason why the control circuit 14 can immediately set the parameter 22, etc. in the parameter registers R0 to Rm+1 at the time of the erase operation is that the parameter 22, etc. in the memory circuit 15 have been read out batchwise in advance into the cache memories C0 to Cm+1 at the time of the power-on operation.

Subsequently, the same steps ST10-2 to ST10-6 of the erase operation as in the third embodiment are executed, and the erase operation of the present embodiment is carried out.

(Step ST10-7)

Then, if the result of the above-described check shows that the pass of the erase verify level is enabled, the control circuit 14 writes the pulse number 25 of the erase voltage Vera, which is set in the parameter register Rm−1, in the memory cell MTm−1 and the cache memory Cm−1.

As described above, the steps ST10-1 to ST10-7 are performed, and the erase operation of this embodiment can be executed.

<Read Operation>

Figure 32:
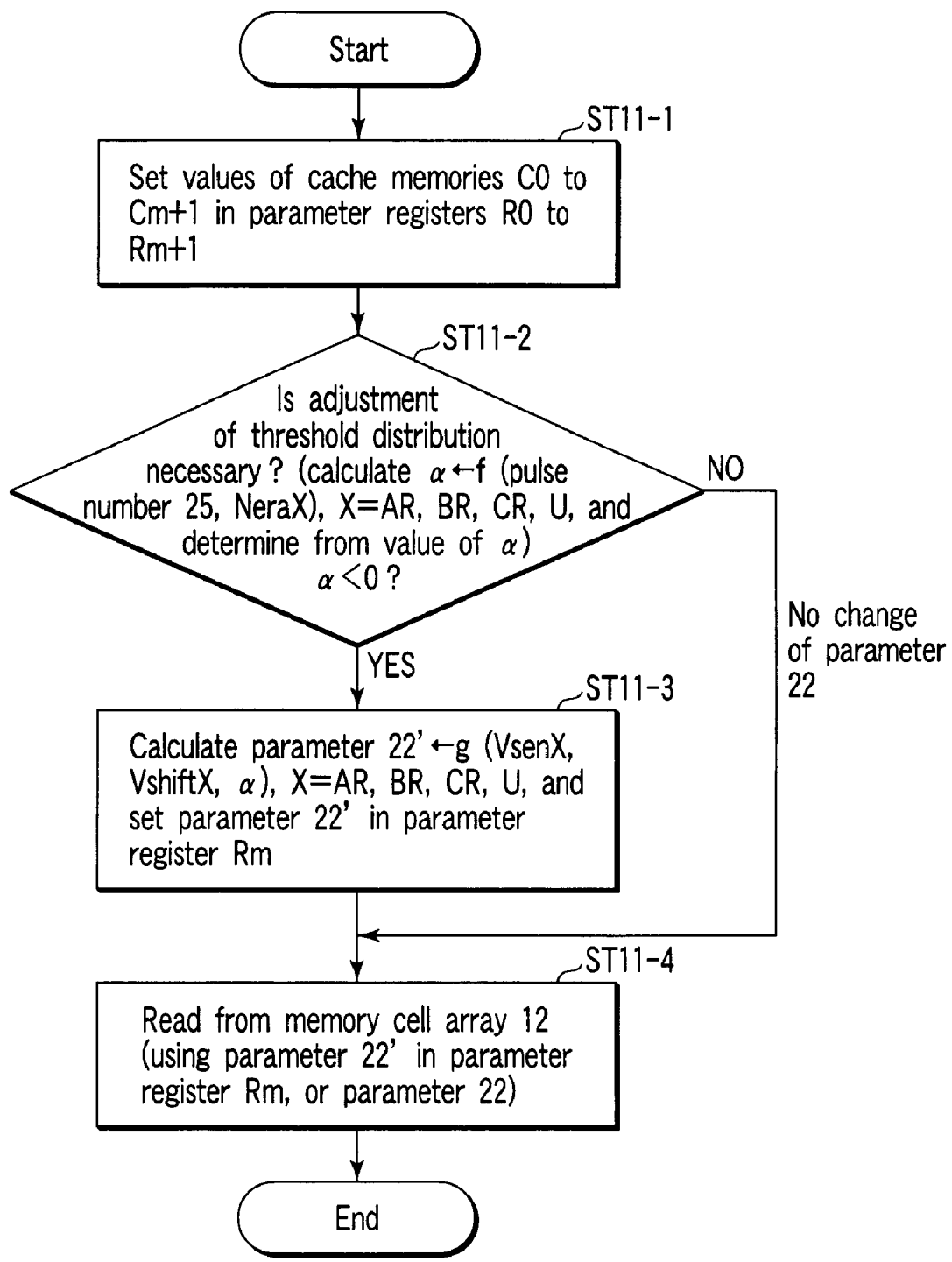
FIG. 32 is a flow chart illustrating a read operation of the semiconductor memory device according to the fourth embodiment.

Next, referring to FIG. 32, a description is given of a read operation, which is an embodiment of the control method of the semiconductor memory device according to the present embodiment.

(Step ST5-1)

To start with, unlike the third embodiment, the control circuit 14 sets the data, which have been read out to the cache memories C0 to Cm+1, in the associated parameter registers R0 to Rm+1. For example, the parameter 22 and the reference pulse number NeraX, VsenX, VshiftX (X=EV, AV, BV, CV, AR, BR, CR, U) that are stored in the cache memories are set in the associated parameter registers.

Subsequently, the same steps ST11-2 to ST11-4 of the read operation as in the third embodiment are executed, and the read operation of the present embodiment is carried out.

<Write Operation>

Figure 33:
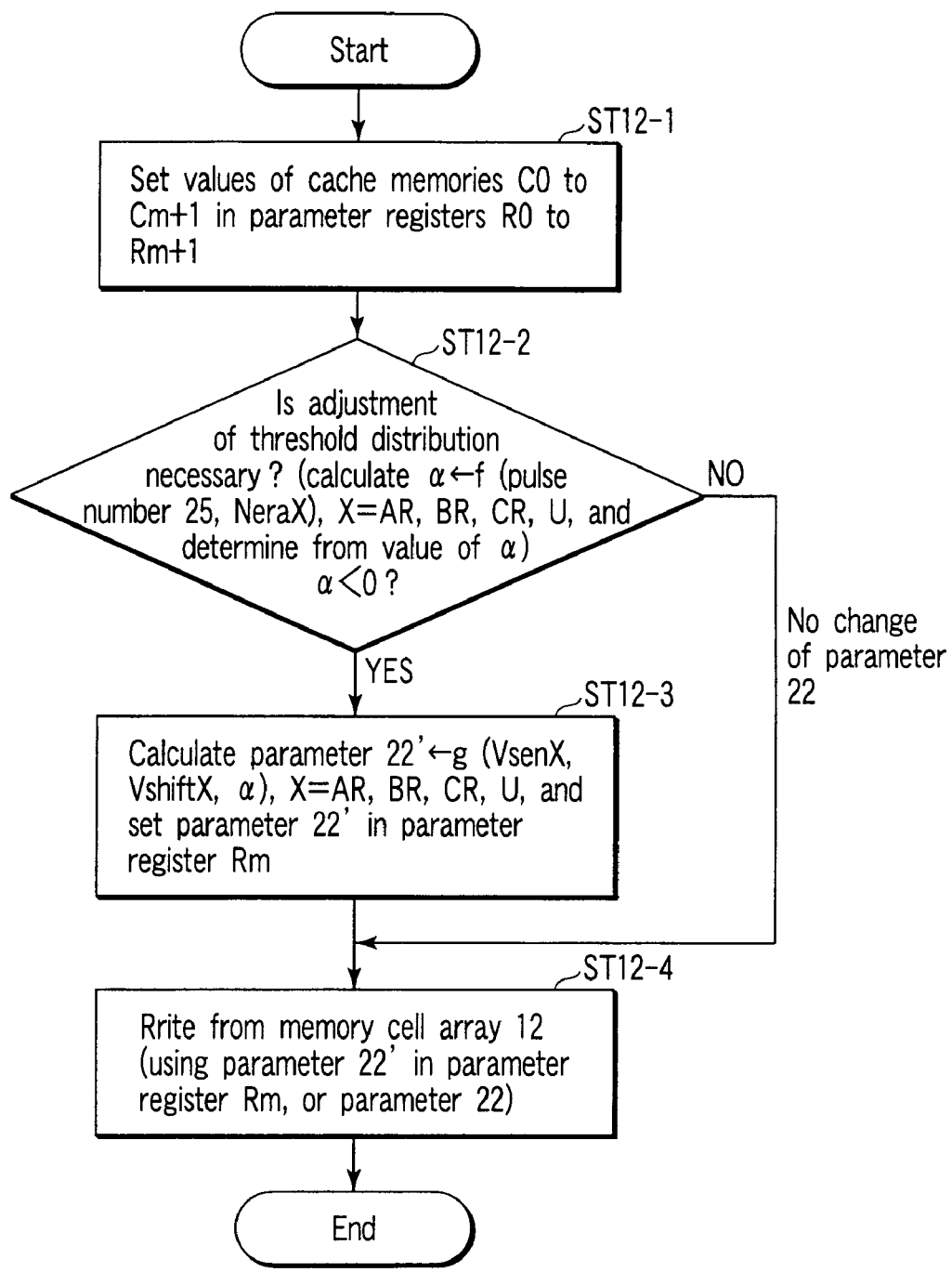
FIG. 33 is a flow chart illustrating a write operation of the semiconductor memory device according to the fourth embodiment.

Next, referring to FIG. 33, a description is given of a write operation, which is an embodiment of the control method of the semiconductor memory device according to the present embodiment.

(Step ST12-1)

To start with, unlike the third embodiment, the control circuit 14 sets the data, which have been read out to the cache memories C0 to Cm+1, in the associated parameter registers R0 to Rm+1. For example, the parameter 22 and the reference pulse number NeraX, VsenX, VshiftX (X=EV, AV, BV, CV, AR, BR, CR, U) that are stored in the cache memories are set in the associated parameter registers.

Subsequently, the same steps ST12-2 to ST12-4 of the write operation as in the third embodiment are executed, and the write operation of the present embodiment is carried out.

As has been described above, according to the present embodiment, the same advantageous effects as the above-described (1) to (7) can be obtained. Furthermore, the present embodiment is advantageous in achieving high-speed performance, as mentioned in the above-described (5).

Aspects Included in the Embodiments

The above-described embodiments include the following aspects:

(1) A semiconductor memory device comprising:
a memory cell array;
a voltage generating circuit;
a memory circuit which stores a reference pulse number of an erase voltage of the memory cell array and a parameter; and a control circuit which controls, when a pulse number of the erase voltage exceeds the reference pulse number of the erase voltage, the voltage generating circuit in a manner to increase at least an erase verify level in accordance with the parameter.

(2) The device according to the aspect (1), further comprising:
a plurality of cache memories into which the reference pulse number and the parameter are read out batchwise from the memory circuit; and
a plurality of parameter registers in which the reference pulse number and the parameter, which are read out, are set.

(3) The device according to the aspect (1), wherein the control circuit controls, when the pulse number of the erase voltage exceeds the reference pulse number of the erase voltage, the voltage generating circuit in a manner to increase a program verify level, a read level and an intermediate potential level in accordance with the parameter.

(4) The device according to the aspect (1), wherein the reference pulse number of the erase voltage and the parameter are stored in association with each of erase units or each of read units of the memory cell array.

(5) The device according to the aspect (1), wherein the device is capable of storing multi-bit data in one memory cell disposed in the memory cell array,
the memory circuit stores a plurality of reference pulse numbers, a plurality of sense-time voltages and a plurality of threshold voltage bottom shift amounts, and
the device further comprises an arithmetic circuit which determines the parameter on the basis of the plurality of reference pulse numbers, the plurality of sense-time voltages and the plurality of threshold voltage bottom shift amounts.

(6) The device according to the aspect (5), wherein the arithmetic circuit comprises:
a deterioration information detection circuit which detects deterioration information on the basis of the parameter and the plurality of reference pulse numbers; and
a shift amount determination circuit which determines a shift amount on the basis of the deterioration information, the plurality of sense-time voltages and the plurality of threshold voltage bottom shift amounts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array;
a voltage generating circuit;
a memory circuit which stores a reference pulse number of an erase voltage of the memory cell array and a parameter; and
a control circuit which controls, when a pulse number of the erase voltage exceeds the reference pulse number of the erase voltage, the voltage generating circuit in a manner to increase at least an erase verify level in accordance with the parameter.

2. The device according to claim 1, further comprising:
a plurality of parameter registers in which the reference pulse number and the parameter, which are read out, are set.

3. The device according to claim 1, further comprising:
a plurality of cache memories into which the reference pulse number and the parameter are read out batchwise from the memory circuit.

4. The device according to claim 1, wherein the control circuit controls, when the pulse number of the erase voltage exceeds the reference pulse number of the erase voltage, the voltage generating circuit in a manner to increase a program verify level, a read level and an intermediate potential level in accordance with the parameter.

5. The device according to claim 1, wherein the reference pulse number of the erase voltage and the parameter are stored in association with each of erase units or each of read units of the memory cell array.

6. The device according to claim 1, wherein the memory circuit stores a sense-time voltage and a threshold voltage bottom shift amount, and
the device further comprises an arithmetic circuit which determines the parameter on the basis of the reference pulse number, the sense-time voltage and the plurality of threshold voltage bottom shift amount.

7. The device according to claim 6, wherein the arithmetic circuit comprises a deterioration information detection circuit which detects deterioration information on the basis of the parameter and the reference pulse number.

8. The device according to claim 7, wherein the arithmetic circuit further comprises a shift amount determination circuit which determines a shift amount on the basis of the deterioration information, the sense-time voltage and the threshold voltage bottom shift amount.

9. The device according to claim 1, wherein the memory circuit is a first page composed of a plurality of memory cells which have control electrodes commonly connected to a word line, and
the first page comprises a first data area and a first redundant area which includes a first error correcting code area and stores the parameter and the reference pulse number.

10. The device according to claim 9, wherein the device is capable of storing multi-bit data in one memory cell disposed in the memory cell array,
the memory circuit is a second page composed of a plurality of memory cells which have control electrodes commonly connected to a word line, and
the second page comprises a second data area and a second redundant area which includes a second error correcting code area and stores the parameter and the reference pulse number, a ratio of occupation of the second error correcting code area in the second redundant area being set to be greater than a ratio of occupation of the first error correcting code area in the first redundant area.

11. The device according to claim 6, wherein the device is a multilevel NAND flash memory.

12. A control method of a semiconductor memory device including a memory cell array, a voltage generating circuit, a memory circuit which stores a reference pulse number of an erase voltage of the memory cell array and a parameter, and a control circuit which controls the voltage generating circuit, the method comprising:
causing the control circuit to check whether a pulse number of the erase voltage exceeds the reference pulse number of the erase voltage, thereby detecting deterioration information of the memory cell array;
changing, if the pulse number of the erase voltage exceeds the reference pulse number of the erase voltage, the parameter in a manner to increase at least an erase verify level; and
controlling the voltage generating circuit in a manner to apply the erase voltage to the memory cell array by using the changed parameter, and executing an erase operation.

13. The control method of a semiconductor memory device, according to claim 12, further comprising:
- causing the control circuit to check, after the erase operation, whether the parameter is changed or not, thereby detecting the deterioration information of the memory cell array; and
- executing, in a case where the parameter is changed, a read operation for read from the memory cell array by using the parameter that is changed in a manner to increase a read level at a time of the read operation.

14. The control method of a semiconductor memory device, according to claim 12, further comprising:
- causing the control circuit to check, after the erase operation, whether the parameter is changed or not, thereby detecting the deterioration information of the memory cell array; and
- executing, in a case where the parameter is changed, a write operation for write in the memory cell array by using the parameter that is changed in a manner to increase a program verify level at a time of the write operation.

15. The control method of a semiconductor memory device, according to claim 12, wherein the device is capable of storing multi-bit data in one memory cell disposed in the memory cell array,
- the memory circuit stores a plurality of reference pulse numbers, a plurality of sense-time voltages and a plurality of threshold voltage bottom shift amounts,
- the device further comprises an arithmetic circuit which determines the parameter on the basis of the plurality of reference pulse numbers, the plurality of sense-time voltages and the plurality of threshold voltage bottom shift amounts, the arithmetic circuit comprising a deterioration information detection circuit which detects deterioration information on the basis of the parameter and the plurality of reference pulse numbers, and a shift amount determination circuit which determines a shift amount on the basis of the deterioration information, the plurality of sense-time voltages and the plurality of threshold voltage bottom shift amounts,
- the deterioration information detection circuit executes a first function to detect the deterioration information on the basis of the parameter and the plurality of reference pulse numbers,
- the shift amount determination circuit executes, in a case where adjustment of a threshold voltage distribution is determined to be necessary on the basis of the detected deterioration information, a second function to calculate a shift amount on the basis of the deterioration information, the sense-time voltages and the bottom shift amounts, thus changing the parameter in a manner to increase the erase verify level voltage; and
- the control circuit controls the voltage generating circuit on the basis of the changed parameter, and executes the erase operation.

16. The control method of a semiconductor memory device, according to claim 15, wherein the control circuit checks, after the erase operation, whether the parameter is changed or not, thereby detecting the deterioration information of the memory cell array,
- the shift amount determination circuit executes, in a case where the adjustment of the threshold voltage distribution is determined to be necessary on the basis of the detected deterioration information, the second function to calculate a plurality of shift amounts, with respect to a plurality of threshold voltage distributions, on the basis of the deterioration information, the plurality of sense-time voltages and the plurality of bottom shift amounts, thus changing the parameter in a manner to increase values of a plurality of discrimination level voltages, and
- the control circuit controls the voltage generating circuit on the basis of the changed parameter, and executes a read operation.

17. The control method of a semiconductor memory device, according to claim 15, wherein the control circuit checks, after the erase operation, whether the parameter is changed or not, thereby detecting the deterioration information of the memory cell array,
- the shift amount determination circuit executes, in a case where the adjustment of the threshold voltage distribution is determined to be necessary on the basis of the detected deterioration information, the second function to calculate a plurality of shift amounts, with respect to a plurality of threshold voltage distributions, on the basis of the deterioration information, a plurality of program verify level voltages and the plurality of bottom shift amounts, thus changing the parameter in a manner to increase the plurality of program verify level voltages, and
- the control circuit controls the voltage generating circuit on the basis of the changed parameter, and executes a write operation.

* * * * *